United States Patent
Kim et al.

(10) Patent No.: US 12,557,357 B2
(45) Date of Patent: Feb. 17, 2026

(54) SEMICONDUCTOR DEVICE AND METHOD OF MANUFACTURING THE SAME

(71) Applicant: SAMSUNG ELECTRONICS CO., LTD., Suwon-si (KR)

(72) Inventors: Kihwan Kim, Suwon-si (KR); Kyungho Kim, Suwon-si (KR); Kanghun Moon, Suwon-si (KR); Choeun Lee, Suwon-si (KR); Yonguk Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 460 days.

(21) Appl. No.: 18/100,688

(22) Filed: Jan. 24, 2023

(65) Prior Publication Data
US 2023/0395660 A1 Dec. 7, 2023

(30) Foreign Application Priority Data
Jun. 3, 2022 (KP) .................. 10-2022-0068510

(51) Int. Cl.
*H01L 29/06* (2006.01)
*H01L 29/08* (2006.01)
(Continued)

(52) U.S. Cl.
CPC .......... *H10D 62/121* (2025.01); *H10D 30/43* (2025.01); *H10D 30/6211* (2025.01); *H10D 30/6757* (2025.01); *H10D 62/151* (2025.01)

(58) Field of Classification Search
CPC .... H10D 30/014; H10D 30/024; H10D 30/43; H10D 30/62; H10D 30/6211;
(Continued)

(56) References Cited

U.S. PATENT DOCUMENTS 6,605,847 B2  8/2003 Kim et al.
7,253,060 B2  8/2007 Yun et al.
(Continued)

FOREIGN PATENT DOCUMENTS

KR  10-0414217 B1  1/2004
KR  10-0618831 B1  9/2006
(Continued)

OTHER PUBLICATIONS

Communication issued Oct. 26, 2023 by the European Patent Office in European Patent Application No. 23170499.0.
(Continued)

*Primary Examiner* — David C Spalla
(74) *Attorney, Agent, or Firm* — Sughrue Mion, PLLC

(57) ABSTRACT

A semiconductor device, including a fin active region; a device isolation layer covering two sidewalls of the fin active region on the substrate; a gate structure; a nano-sheet structure including a plurality of nano-sheets; and source/drain regions disposed on the fin active region and adjacent to the gate structure, wherein each source/drain region of the source/drain regions includes a buffer layer, an inner impurity layer, and a central impurity layer which are sequentially stacked, wherein the buffer layer fills a first indentation between two vertically-adjacent nano-sheets and a second indentation between the top surface of the fin active region and a nano-sheet, and wherein the plurality of nano-sheets contact side surfaces of the inner impurity layer.

20 Claims, 26 Drawing Sheets

(51) Int. Cl.
  *H01L 29/775*  (2006.01)
  *H01L 29/78*  (2006.01)
  *H01L 29/786*  (2006.01)
  *H10D 30/43*  (2025.01)
  *H10D 30/62*  (2025.01)
  *H10D 30/67*  (2025.01)
  *H10D 62/10*  (2025.01)
  *H10D 62/13*  (2025.01)

(58) Field of Classification Search
  CPC ........... H10D 30/6212; H10D 30/6213; H10D 30/6219; H10D 30/6713; H10D 30/6735; H10D 30/757; H10D 30/797; H10D 62/021; H10D 62/118; H10D 62/119; H10D 62/121; H10D 62/149; H10D 62/151; H10D 84/013; H10D 84/00158; H10D 84/017; H10D 84/0193; H10D 84/834; H10D 84/853
  See application file for complete search history.

(56) References Cited

U.S. PATENT DOCUMENTS

| | | | |
|---|---|---|---|
| 9,853,129 | B2 | 12/2017 | Bauer et al. |
| 11,227,917 | B1 | 1/2022 | Chung et al. |
| 11,264,381 | B2 | 3/2022 | Lee et al. |
| 11,508,621 | B2 | 11/2022 | More |
| 11,735,480 | B2 * | 8/2023 | Xie .................... H10D 84/0133 257/374 |
| 11,996,484 | B2 * | 5/2024 | Lin .................... H10D 30/6713 |
| 12,040,405 | B2 * | 7/2024 | Lin ..................... H10D 64/018 |
| 2020/0365692 | A1 | 11/2020 | Jung et al. |
| 2021/0066477 | A1 * | 3/2021 | Lee .................... H10D 84/0158 |
| 2021/0408237 | A1 | 12/2021 | Lee et al. |
| 2022/0037340 | A1 | 2/2022 | Yang et al. |
| 2022/0052046 | A1 | 2/2022 | Choi et al. |
| 2022/0059654 | A1 | 2/2022 | Kim et al. |
| 2022/0059703 | A1 | 2/2022 | More |
| 2022/0069078 | A1 | 3/2022 | Yu et al. |

FOREIGN PATENT DOCUMENTS

| | | |
|---|---|---|
| KR | 10-2020-0007452 A | 1/2020 |
| KR | 10-2020-0132436 A | 11/2020 |
| TW | 202209449 A | 3/2022 |
| TW | 202209555 A | 3/2022 |

OTHER PUBLICATIONS

Communication issued Mar. 13, 2025 by the Taiwan Patent Office in Taiwanese Patent Application No. 112116391.
Communication dated Dec. 18, 2025, issued by the Korean Patent Office in Korean Application No. 10-2022-0068510.

* cited by examiner

SEMICONDUCTOR DEVICE AND METHOD OF MANUFACTURING THE SAME

CROSS-REFERENCE TO RELATED APPLICATION

This application is based on and claims priority under 35 U.S.C. § 119 to Korean Patent Application No. 10-2022-0068510, filed on Jun. 3, 2022, in the Korean Intellectual Property Office, the disclosure of which is incorporated by reference herein in its entirety.

BACKGROUND

1. Field

The disclosure relates to a semiconductor device, and more particularly, to a semiconductor device including a field-effect transistor (FET) and a method of manufacturing the same.

2. Description of Related Art

As the size of integrated circuit devices decreases, the degree of integration of FETs on a substrate is gradually increasing, and thus, a nano-sheet (NS)-FET including a plurality of nano-sheets stacked on the same layout area is being developed. As the degree of integration of semiconductor devices increases and the sizes of the semiconductor devices decrease, the process defects in a process of manufacturing NS-FETs are increasing. Therefore, a structure capable of minimizing process defects and improving the performance and reliability of a NS-FET is demanded.

SUMMARY

Provided are a semiconductor device with minimized defects and improved performance and reliability and a method of manufacturing the same.

In addition, the technical goals to be achieved by embodiments are not limited to the technical goals mentioned above, and other technical goals may be clearly understood by one of ordinary skill in the art from the following descriptions.

Additional aspects will be set forth in part in the description which follows and, in part, will be apparent from the description, or may be learned by practice of the presented embodiments.

In accordance with an aspect of the disclosure, a semiconductor device includes a fin active region having a structure protruding from a substrate and extending in a first direction; a device isolation layer covering two sidewalls of the fin active region on the substrate; a gate structure extending in a second direction on the fin active region and the device isolation layer, wherein the second direction intersects the first direction; a nano-sheet structure including a plurality of nano-sheets spaced apart from each other in a vertical direction from a top surface of the fin active region; and source/drain regions disposed on the fin active region and adjacent to the gate structure, wherein each source/drain region of the source/drain regions includes a buffer layer, an inner impurity layer, and a central impurity layer which are sequentially stacked, wherein the buffer layer fills a first indentation between two vertically-adjacent nano-sheets and a second indentation between the top surface of the fin active region and a nano-sheet, and wherein the plurality of nano-sheets contact side surfaces of the inner impurity layer.

In accordance with an aspect of the disclosure, a semiconductor device includes a fin active region extending in a first direction; a gate structure extending across the fin active region in a second direction perpendicular to the first direction; a nano-sheet structure including a plurality of nano-sheets spaced apart from each other in a vertical direction from a top surface of the fin active region; and source/drain regions disposed on the fin active region on both sides of the gate structure, wherein the source/drain regions include a buffer layer, an inner impurity layer, and a central impurity layer which are sequentially stacked, wherein the buffer layer includes a plurality of protrusions extending in the first direction and spaced apart from each other in the vertical direction, and wherein an end portion of each of the plurality of nano-sheets is sandwiched between two vertically-adjacent protrusions or between a spacer of the gate structure and a protrusion, and wherein the end portion contacts the inner impurity layer.

In accordance with an aspect of the disclosure, a semiconductor device includes a fin active region having a structure which protrudes from a substrate and extends in a first direction; a device isolation layer covering two sidewalls of the fin active region on the substrate; a gate structure extending in a second direction on the fin active region and the device isolation layer, wherein the second direction intersects the first direction; a nano-sheet structure including a plurality of nano-sheets spaced apart from each other in a vertical direction from a top surface of the fin active region; and source/drain regions disposed on the fin active region and adjacent to the gate structure, wherein the source/drain regions include a buffer layer, an inner impurity layer, and a central impurity layer that are sequentially stacked, wherein the buffer layer includes a plurality of first protrusions extending in the first direction and spaced apart from each other in the vertical direction, each nano-sheet of the plurality of nano-sheets is surrounded by a metal gate of the gate structure in a gate all around (GAA) structure, and wherein an end portion of the each nano-sheet is sandwiched between two vertically-adjacent first protrusions, or between a spacer of the gate structure and a first protrusion, and wherein the end portion contacts the inner impurity layer.

In accordance with an aspect of the disclosure, a method of manufacturing a semiconductor device includes forming a stacked structure by alternately stacking sacrificial semiconductor layers and nano-sheet semiconductor layers on a substrate; forming a fin active region which extends in a first direction, and a stacked pattern structure on the fin active region, by etching portions of the stacked structure and the substrate; forming a device isolation layer covering two sidewalls of the fin active region; forming a dummy gate structure which extends in a second direction on the stacked pattern structure and the device isolation layer, wherein the second direction intersects with the first direction; exposing a top surface of the fin active region by etching the stacked pattern structure using the dummy gate structure as an etching mask, and forming a trench that divides the stacked pattern structure into a plurality of nano-sheet structures; forming a source/drain region by growing an epitaxial layer in the trench; removing polysilicon of the dummy gate structure and a sacrificial semiconductor layer of the stacked pattern structure; and forming a gate structure by filling removed portions with a metal, wherein each nano-sheet structure of the plurality of nano-sheet structures includes a plurality of nano-sheets which include a nano-sheet semiconductor layer and are spaced apart from each other in a vertical direction from a top surface of the fin active region, wherein the forming of the source/drain region includes sequentially forming a buffer layer, an inner impurity layer, and a central impurity layer in the trench, wherein the buffer layer extends into a first indentation between two vertically-adjacent nano-sheets, and a second indentation between the top surface of the fin active region and a nano-sheet, and wherein the plurality of nano-sheets contact the inner impurity layer.

In accordance with an aspect of the disclosure, a semiconductor device includes a fin active region protruding from a substrate and extending in a first horizontal direction; a gate structure extending in a second horizontal direction on the fin active region, wherein the second horizontal direction intersects the first horizontal direction; a first nano-sheet spaced apart from the fin active region in a vertical direction; a second nano-sheet spaced apart from the first nano-sheet in the vertical direction; and a source/drain region disposed on the fin active region and adjacent to the gate structure, and including a buffer layer and an inner impurity layer, wherein the buffer layer fills a first indentation between the fin active region and the first nano-sheet, and a second indentation between the first nano-sheet and the second nano-sheet, and wherein the first nano-sheet and the second nano-sheet contact side surfaces of the inner impurity layer.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION OF THE EMBODIMENTS

Hereinafter, terms such as "upper," "middle," and "lower" may be replaced with other terms, for example, "first," "second," and "third" to describe elements of the specification. Terms such as "first," "second," and "third" may be used to describe different elements, but the elements are not limited by the terms, and a "first element" may be referred to as a "second element."

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 1:
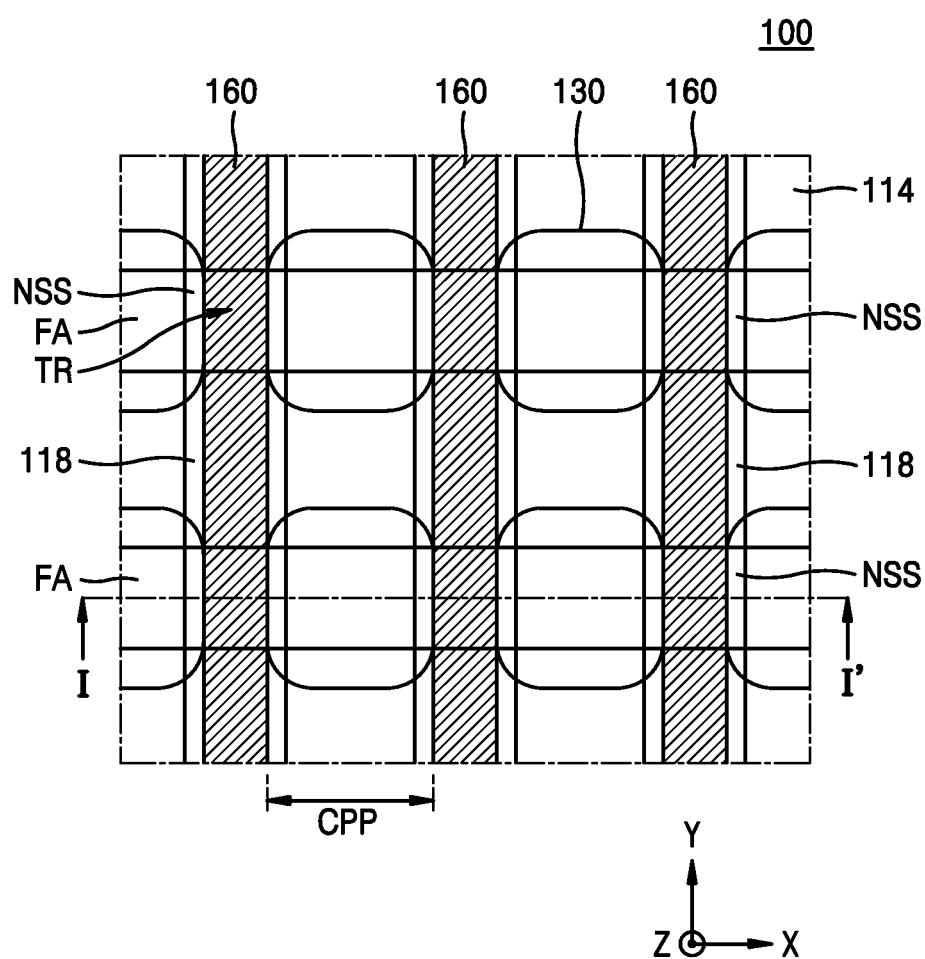
FIG. 1 is a plan layout of a semiconductor device according to an embodiment.
Figure 2A:
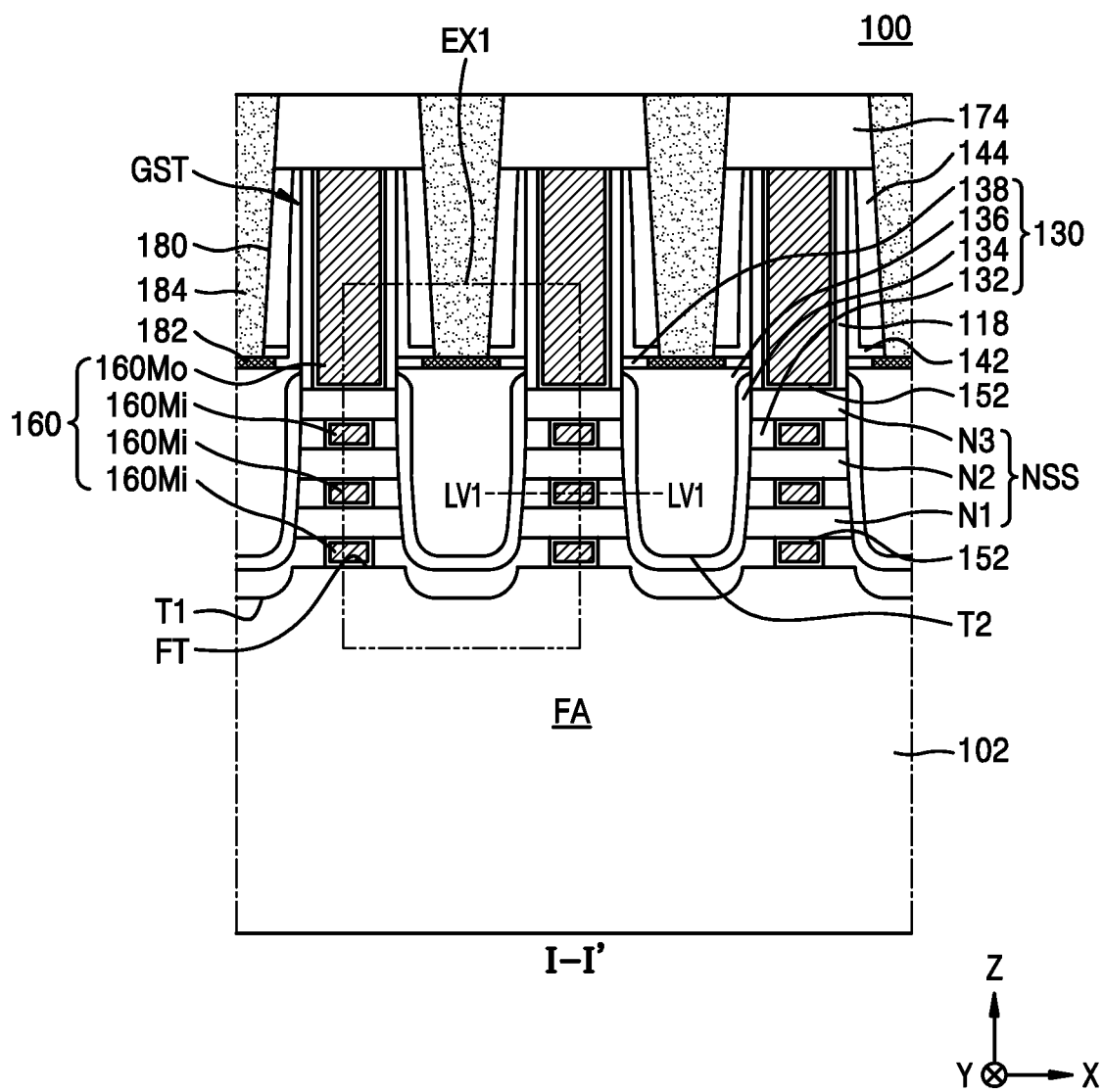
FIG. 2A is a cross-sectional view obtained along a line I-I' of FIG. 1, according to an embodiment.
Figure 2B:
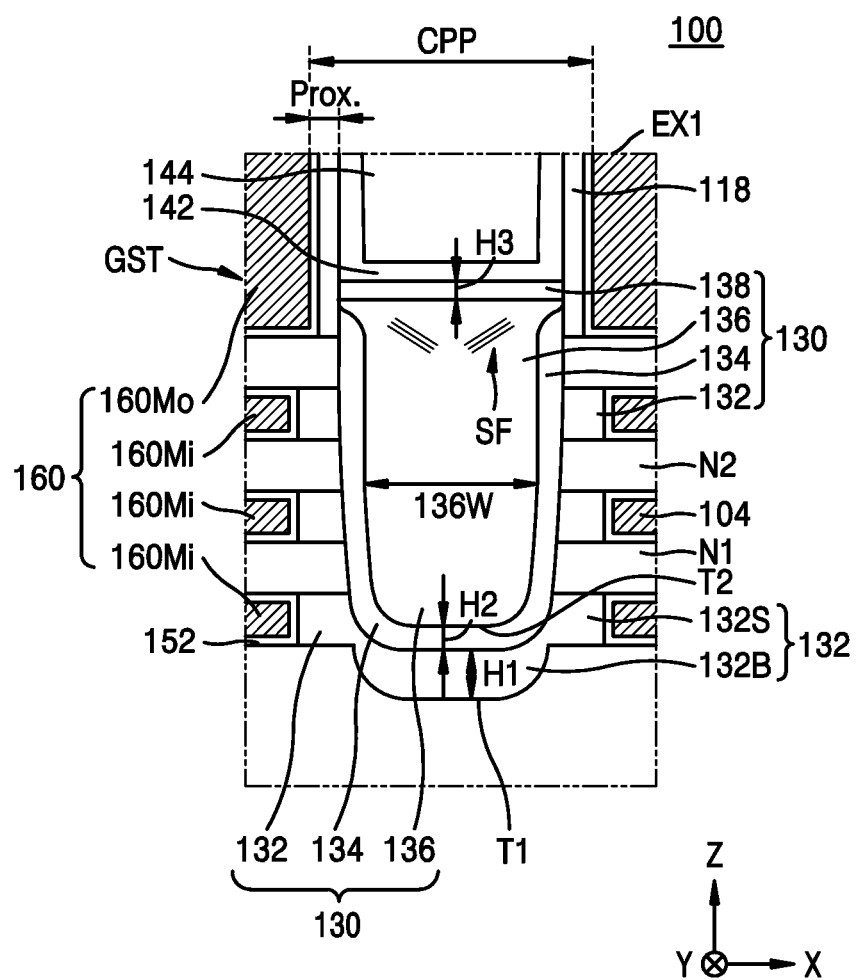
FIG. 2B is an enlarged cross-sectional view of a portion EX1 of FIG. 2A, according to an embodiment.
Figure 2C:
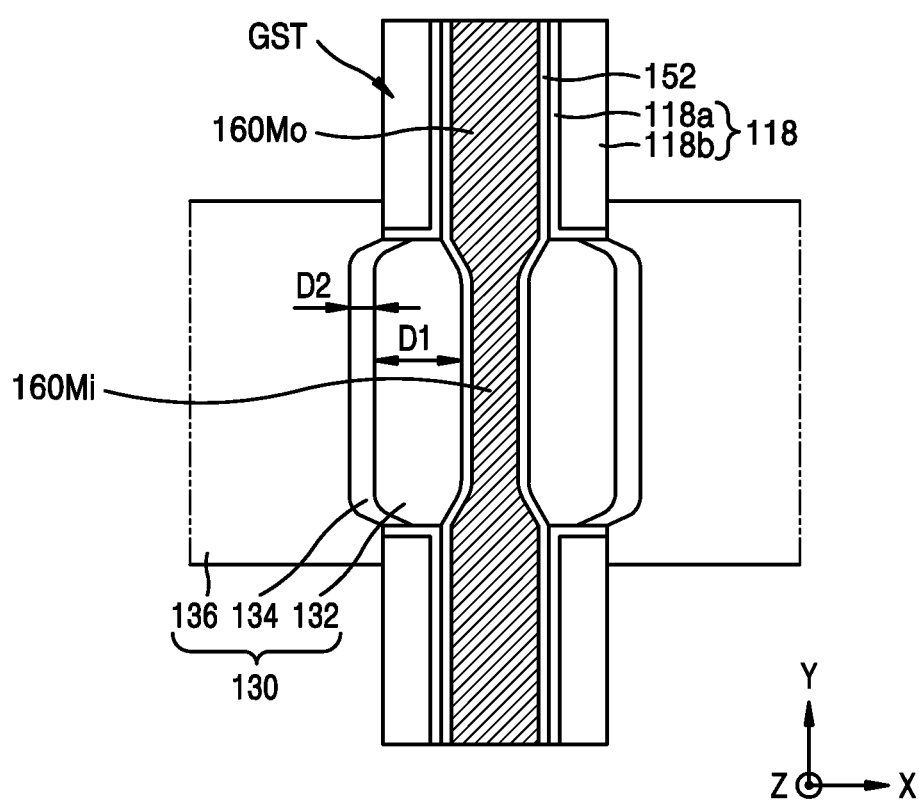
FIG. 2C is an enlarged plan view corresponding to a first level LV1 of FIG. 2A, according to an embodiment.

FIG. 1 is a plan layout of a semiconductor device according to an embodiment, FIG. 2A is a cross-sectional view taken along a line I-I' of FIG. 1, FIG. 2B is an enlarged cross-sectional view of a portion EX1 of FIG. 2A, and FIG. 2C is an enlarged plan view corresponding to a first level LV1 of FIG. 2A. In FIG. 2B, a metal silicide layer and contact plugs are omitted.

Referring to FIGS. 1 to 2C, a semiconductor device 100 according to embodiments may include fin active regions FA, nano-sheet structures NSS, and gate structures GST. The semiconductor device 100 according to embodiments may be, for example, an N-type metal-oxide-semiconductor (NMOS) field-effect transistor (FET) including the nano-sheet structures NSS.

A plurality of fin active regions FA may be arranged on a substrate 102. The fin active region FA may extend in a first direction X. The plurality of fin active regions FA may be spaced apart from one another in a second direction Y. The fin active region FA may have a structure protruding from the substrate 102 in a vertical direction, for example a third direction (Z, and may extend in the first direction X.

The substrate 102 may include a semiconductor such as silicon (Si) or germanium (Ge) or a compound semiconductor like silicon-germanium (SiGe), silicon carbide (SiC), gallium arsenide (GaAs), indium arsenide (InAs), indium gallium arsenide (InGaAs), or indium phosphide (InP). A device isolation layer 114 covering both sidewalls of the fin active region FA may be disposed on the substrate 102. The device isolation layer 114 may include an oxide film, a nitride film, or a combination thereof.

A nano-sheet structure NSS may be disposed to be spaced apart from a top surface FT of the fin active region FA corresponding to the nano-sheet structure NSS in the third direction Z. Also, the nano-sheet structure NSS may include a plurality of nano-sheets N1, N2, and N3 spaced apart from one another in the third direction Z. Here, a nano-sheet may refer to a conductive structure through which a current may flow, and which may have a flat plate-like shape. Also, a nano-sheet may include nano-wires in the form of strings. In FIGS. 2A and 2C, one nano-sheet structure NSS is illustrated as including three nano-sheets N1, N2, and N3, but the number of nano-sheets included in one nano-sheet structure NSS is not limited thereto.

The gate structure GST may include a gate line 160, a gate dielectric layer 152, and a spacer 118. A plurality of gate lines 160 may be arranged on the fin active region FA and the device isolation layer 114. The plurality of gate lines 160 may each extend across the fin active regions FA in the second direction Y intersecting with the first direction X. The plurality of gate lines 160 may be arranged to be spaced apart from one another in the first direction X.

The nano-sheet structure NSS may be disposed in a region at which the fin active region FA and the gate line 160 intersect with each other. The nano-sheet structure NSS may be spaced apart from the fin active region FA and face the top surface FT of the fin active region FA. The plurality of nano-sheets N1, N2, and N3 of the nano-sheet structure NSS may be different distances apart from the top surface FT of the fin active region FA, for example distances in the third direction Z. For example, the plurality of nano-sheets N1, N2, and N3 may include a first nano-sheet N1, a second nano-sheet N2, and a third nano-sheet N3 that are sequentially stacked on the top surface FT of the fin active region FA.

Although FIG. 1 shows the nano-sheet structure NSS having a substantially rectangular planar shape, the planar shape of the nano-sheet structure NSS is not limited to rectangular shapes. For example, the nano-sheet structure NSS may have various planar shapes depending on the planar shape of each of the fin active region FA and the gate line 160. In the semiconductor device 100 according to embodiments, the plurality of nano-sheet structures NSS and the plurality of gate lines 160 may be arranged on one fin active region FA. The plurality of nano-sheet structures NSS may be arranged on one fin active region FA along a line in the first direction X. The number of nano-sheet structures NSS and the number of gate lines 160 arranged in one fin active region FA are not limited to any particular numbers.

Each nano-sheet of the plurality of nano-sheets N1, N2, and N3 may be included in a channel region of an NMOS FET. The plurality of nano-sheets N1, N2, and N3 may each have a thickness in a range from about 4 nm to about 6 nm, but are not limited thereto. Here, the thickness may refer to a thickness in the third direction Z. According to some embodiments, the plurality of nano-sheets N1, N2, and N3 may have substantially the same thickness in the third direction Z. Also, according to other embodiments, at least one of the plurality of nano-sheets N1, N2, and N3 may have a thickness different from that of the other nano-sheets in the third direction Z.

As shown in FIG. 2A, the plurality of nano-sheets N1, N2, and N3 may have substantially the same width in the first direction X. However, according to some embodiments, at least one of the plurality of nano-sheets N1, N2, and N3 may have a width different from that of the other nano-sheets in the first direction X. For example, in the first direction X, the width of each of the first nano-sheet N1 and the second nano-sheet N2 close to the top surface FT of the fin active region FA from among the plurality of nano-sheets N1, N2, and N3 may be less than the width of the third nano-sheet N3 farthest from the top surface FT of the fin active region FA. In this structure, effective channel lengths of channels formed in the first nano-sheet N1 and the second nano-sheet N2 may be less than an effective channel length of a channel formed in the third nano-sheet N3, and thus, an amounts of current flowing through the first nano-sheet N1 and the second nano-sheet N2 may be increased under the same operating voltage.

A plurality of first trenches T1 may be formed in the fin active region FA. Here, a first trench T1 may include a recess (which may correspond to recess R1 of FIG. 7B as described below) of the upper portion of the fin active region FA. Therefore, the first trench T1 may be defined from the top surface of the nano-sheet structure NSS, that is, the top surface of the third nano-sheet N3, to the bottom surface of a recess R1. Also, as shown in FIGS. 2A and 2B, the bottom surface of the first trench T1 may be lower than the top surface FT of the fin active region FA. However, according to some embodiments, the bottom surface of the first trench T1 may have substantially the same height as the top surface FT of the fin active region FA. In the semiconductor device 100 according to embodiments, a distance in the third direction Z between the bottom surface of the first trench T1 and the top surface FT of the fin active region FA may be 20 nanometers (nm) or less. However, the distance is not limited to the numerical range stated above.

A source/drain region 130 may be disposed in the first trench T1. The source/drain region 130 may include an epitaxial layer, that is, an epitaxially grown semiconductor layer. The source/drain region 130 may include a combination of a group IV element semiconductor and a group IV compound semiconductor. At least a portion of the source/drain region 130 may be doped with an n-type dopant. In the semiconductor device 100 according to embodiments, the n-type dopant may include at least one of phosphorus (P), arsenic (As), and antimony (Sb).

The source/drain region 130 may include a buffer layer 132, an inner impurity layer 134, and a central impurity layer 136, and a capping layer 138 that are sequentially stacked in a direction away from the fin active region FA in the third direction Z. According to embodiments, considering a functional aspect, the buffer layer 132 may not be included in the source/drain region 130 and may be treated as a separate layer.

As shown in FIG. 2B, the buffer layer 132 may include a side buffer layer 132S and a bottom buffer layer 132B. The side buffer layer 132S may be disposed as an indentation structure between two nano-sheets adjacent to each other in the third direction Z or between the first nano-sheet N1 and the top surface FT of the fin active region FA. For example, the side buffer layer 132S may have a structure protruding from the inner impurity layer 134 in the first direction X, that is, a protrusion-like shape.

The bottom buffer layer 132B may have a structure recessed from the top surface FT of the fin active region FA. Accordingly, the bottom surface of the bottom buffer layer 132B may be lower than the top surface FT of the fin active region FA. Also, the top surface of the bottom buffer layer 132B may be lower than the top surface of an inner metal gate 160Mi at the bottom of the gate line 160. A thickness H1 of the bottom buffer layer 132B in the third direction Z may be 10 nm or less. However, the thickness H1 of the bottom buffer layer 132B is not limited thereto.

As shown in FIG. 2C, as the side buffer layer 132S of the buffer layer 132 is formed as an indentation structure, at the first level LV1 in which the middle inner metal gate 160Mi is positioned in the third direction Z, a thickness D1 of the side buffer layer 132S may be relatively greater than a thickness D2 of the inner impurity layer 134, in the first direction X. As described above, as the side buffer layer 132S is formed relatively thick, a short circuit between the source/drain region 130 and the gate line 160 and leakage of the gate line 160 may be prevented, and the resistance characteristics of the channel regions of the nano-sheets N1, N2, and N3 and the resistance characteristics of the source/drain region 130 may be improved. Advantages due to the structure of the buffer layer 132 of the semiconductor device 100 according to embodiments are described below in more detail in comparison with the structure of a comparative example.

The buffer layer 132 may include undoped Si or SiGe containing low concentration Ge. For example, when the buffer layer 132 includes SiGe, the concentration of Ge may be less than 10%. In other words, the buffer layer 132 may include $Si_{1-x}Ge_x$ (x<0.1). However, the concentration of Ge in the buffer layer 132 including SiGe is not limited to the above numerical range. According to some embodiments, the buffer layer 132 may include carbon (C). For example, the buffer layer 132 may include C-doped Si (Si:C) or C-doped SiGe (SiGe:C). The buffer layer 132 may be selectively grown on a layer including Si. For example, the buffer layer 132 may be grown through selective epitaxial growth in the fin active region FA, a nano-sheet semiconductor layer including Si, a sacrificial semiconductor layer including SiGe, etc.

The inner impurity layer 134 may have a structure surrounding the central impurity layer 136. In some embodiments, the inner impurity layer 134 may grow conformally to have an overall uniform thickness. Therefore, a thickness of a side portion of the inner impurity layer 134 on a side surface of the central impurity layer 136 may be similar to a thickness of a bottom portion of the inner impurity layer 134 on the bottom surface of the central impurity layer 136. For example, a difference between the thickness of the side portion of the inner impurity layer 134 and the thickness of the bottom portion of the inner impurity layer 134 may be less than 5 nm. According to some embodiments, the bottom portion of the inner impurity layer 134 may be thicker than the side portion of the inner impurity layer 134. Also, the thickness of the side portion of the inner impurity layer 134 may decrease upward, for example in the third direction Z. For example, a thickness of a portion of the inner impurity layer 134 corresponding to the third nano-sheet N3 may be less than a thickness of a portion of the inner impurity layer 134 corresponding to the first nano-sheet N1 or the second nano-sheet N2.

The inner impurity layer 134 may include Si doped with elements for dopant control. For example, the inner impurity layer 134 may include Si doped with at least one of P, As, and Sb. The inner impurity layer 134 may control a dopant through doped elements, thereby controlling a short channel characteristic (SCF) of an NMOS FET. For example, in the inner impurity layer 134, P may be doped at a low concentration. As another example, because the diffusion problem may not be significant for As or Sb, the inner impurity layer 134 may be doped with As or Sb at any concentration.

According to some embodiments, the inner impurity layer 134 may include Si doped with As or P. As such, when the inner impurity layer 134 includes Si doped with As or P, voids may exist in the inner impurity layer 134. Also, the volume ratio of the voids in the inner impurity layer 134 may be 2% or less.

According to some embodiments, widths of portions of the buffer layer 132 and the inner impurity layer 134 in the first direction X facing a sidewall of the nano-sheet structure NSS may each be less than ⅕ of a separation distance CPP between the plurality of gate lines 160 in the first direction X. Also, according to other embodiments, the widths of portions of the buffer layer 132 and the inner impurity layer 134 in the first direction X facing a sidewall of the nano-sheet structure NSS may each be less than ⅕ of the maximum width of the source/drain region 130 in the first direction X. For example, the widths of portions of the buffer layer 132 and the inner impurity layer 134 in the first direction X facing a sidewall of the nano-sheet structure NSS may each be within the range from 1 nm to 10 nm.

As described above, the buffer layer 132 may include the bottom buffer layer 132B contacting the fin active region FA, and the inner impurity layer 134 may include a bottom portion contacting the bottom buffer layer 132B. A thickness H2 of the bottom portion of the inner impurity layer 134 may be less than the thickness H1 of the bottom buffer layer 132B, in the third direction Z. At least a portion of a top surface T2 of the bottom portion of the inner impurity layer 134 contacting the central impurity layer 136 may extend flat in a horizontal direction, e.g., the first direction X and/or the second direction Y.

The thickness H2 of the bottom portion of the inner impurity layer 134 may be greater than the width of a side portion of the inner impurity layer 134 in the first direction X facing a sidewall of the nano-sheet structure NSS. As such, because the bottom portion of the inner impurity layer 134 has a greater thickness than a side portion of the inner impurity layer 134, it may be advantageous for blocking a leakage current that may be transmitted from the bottom surface of the source/drain region 130 facing the fin active region FA to the fin active region FA. Also, the side portion of the inner impurity layer 134 facing a sidewall of the nano-sheet structure NSS may have a relatively small thickness, thereby contributing to increase in the volume of the central impurity layer 136 in the first trench T1. As the volume of the central impurity layer 136 increases, it may be advantageous for the stress caused by the central impurity layer 136, e.g., tensile stress, to be relatively uniformly applied to each of the plurality of nano-sheets N1, N2, and N3.

According to some embodiments, the thickness H1 of the bottom buffer layer 132B of the buffer layer 132 and the thickness H2 of the bottom portion of the inner impurity layer 134 may each be less than ⅕ of the height of the first trench T1 corresponding to the length from the bottom surface of the first trench T1 to the top surface of the nano-sheet structure NSS in the third direction Z. For example, the thickness H1 of the bottom buffer layer 132B and the thickness H2 of the bottom portion of the inner impurity layer 134 may each be within the range from 1 nm to 10 nm.

The central impurity layer 136 may have a structure having a substantially rectangular vertical cross-section and extending in the third direction Z. As shown in FIG. 2B, the top surface of the central impurity layer 136 may be higher than the top surface of the nano-sheet structure NSS, for example the top surface of the third nano-sheet N3. However, according to some embodiments, the top surface of the central impurity layer 136 may be lower than the top surface of the nano-sheet structure NSS. For example, in the semiconductor device 100 according to embodiments, a distance between the top surface of the nano-sheet structure NSS (e.g., the top surface of the third nano-sheet N3) and the top surface of the central impurity layer 136 the distance in the Z may be from about −2 nm to about 5 nm. However, the distance is not limited to the numerical range stated above. The maximum thickness of the central impurity layer 136 in the third direction Z may be less than a value obtained by subtracting the thickness H1 of a bottom portion of the buffer layer 132 and the thickness H2 of a bottom portion of the inner impurity layer 134 from the depth of the first trench T1.

As shown in FIG. 2B, a portion of the central impurity layer 136 higher than the nano-sheet structure NSS may contact side surfaces of spacers 118. Also, the portion of the central impurity layer 136 higher than the nano-sheet structure NSS may have a width in the first direction X greater than that of a portion of the central impurity layer 136 corresponding to the nano-sheet structure NSS. A stacking fault (SF) may be formed in the upper portion of the central impurity layer 136. Here, the SF may refer to lines formed as epitaxial layers grown in different portions overlap one another during epitaxial growth of the central impurity layer 136.

As another example, the distance in the first direction X between the outermost side surface of the source/drain region 130 and the outermost side surface of the gate line 160 (e.g., an outer metal gate 160Mo) may be referred to as a proximity (denoted in FIG. 2B as Prox.), wherein, in the semiconductor device 100 according to embodiments, the proximity may be from about 0 nm to about 10 nm. In terms of the proximity, the source/drain region 130 may include the inner impurity layer 134 and the central impurity layer 136 and the buffer layer 132 may be excluded from the source/drain region 130. Also, according to some embodiments, the inner impurity layer 134 may also be excluded, and only the central impurity layer 136 may be treated as a source/drain region.

The central impurity layer 136 may include Si doped with a high concentration of P. For example, the concentration of P in the central impurity layer 136 may be within the range from 4% to 12%. In other words, the central impurity layer 136 may include $Si_{1-y}P_y$ (0.04≤y≤0.12). However, the concentration of P in the central impurity layer 136 is not limited to the numerical range stated above.

The capping layer 138 may cover the top surface of the central impurity layer 136 in the source/drain region 130 at a level higher than that of the top surface of the nano-sheet structure NSS in the third direction Z. The bottom surface of the capping layer 138 may contact the top surface of the central impurity layer 136. The capping layer 138 may be spaced apart from the inner impurity layer 134 with the central impurity layer 136 therebetween. The capping layer 138 may be spaced apart from the buffer layer 132 with the inner impurity layer 134 and the central impurity layer 136 therebetween. A thickness H3 of the capping layer 138 in the third direction Z may be greater than zero. For example, the thickness H3 of the capping layer 138 may be within the range from 0.1 nm to 10 nm. However, the thickness H3 of the capping layer 138 is not limited to the above numerical range.

According to some embodiments, the capping layer 138 may include undoped Si. According to some embodiments, the capping layer 138 may include Si doped with any one of P, As, and Sb. According to some embodiments, the capping layer 138 may be omitted.

In the semiconductor device 100 according to embodiments, advantages due to the structure of the buffer layer 132 are described in comparison with the structures of the comparative examples.

First, to prevent a short circuit between a gate line and a source/drain region and leakage of the gate line, consider the structure of an example NMOS FET including a nano-sheet structure in which an internal spacer including silicon nitride (SiN), silicon monoxide (SiO), silicon oxycarbide (SiOC), and silicon oxycarbonitride (SiOCN) is disposed at an internal metal gate. In the case of the structure of the NMOS FET in which an internal spacer is disposed, short circuit and leakage problems may be solved. However, the structure may cause defects during epitaxial layer growth for a source/drain region and increases process variation, and thus, the dispersion of overgrowth (OG) and local dispersion of the source/drain region after the epitaxial layer growth may deteriorate. Also, the structure may cause a defect in which a cavity is formed inside the source/drain region.

In contrast, the semiconductor device 100 according to embodiments may have a structure of an NMOS FET without an internal spacer. Therefore, in the semiconductor device 100 according to embodiments, because an internal spacer is omitted, the problems regarding OG dispersion and local dispersion may be remarkably reduced. Also, in the semiconductor device 100 according to embodiments, because the buffer layer 132 may function like an internal spacer, the short circuit problem between a gate line and a source/drain region and the leakage problem of the gate line may also be solved. In particular, in the semiconductor device 100 according to embodiments, because the buffer layer 132 includes a side buffer layer 134S having a deep indentation structure or a protrusion structure, a short circuit problem between the gate line and the source/drain region and the leakage problem of the gate line may be effectively solved.

Here, in the case where the buffer layer 132 has a structure that does not include a side buffer layer having a deep indentation structure and simply surrounds the inner impurity layer 134, the short circuit problem and the leakage problems may still occur when the thickness of the buffer layer 132 is small. Therefore, the overall thickness of the buffer layer 132 may be increased. However, when the thickness of the buffer layer 132 is increased, the widths of nano-sheets corresponding to a channel region also increase. As a result, the volume of the central impurity layer 136 in the source/drain region 130 decreases, and thus, the resistance of the source/drain region 130 may increase. Furthermore, as the thickness of the buffer layer 132 connected to the nano-sheets and grown increases, dopant diffusion decreases, thereby causing a positive influence on the leakage of a gate line. However, due to insufficient source/drain junction overlap, the resistance of a channel region may also deteriorate. However, in the case of the semiconductor device 100 according to embodiments, by increasing only the thickness of a portion of the buffer layer 132 corresponding to the inner metal gate 160Mi (e.g., the side buffer layer 132S) while maintaining the widths of the nano-sheets, the short circuit problem and the leakage problem may be effectively solved and deterioration of the resistance of a source/drain region and a channel region may be prevented.

The gate line 160 may extend in the second direction Y on the fin active region FA and the device isolation layer 114. The gate line 160 may surround each of the nano-sheets N1, N2, and N3 while covering the nano-sheet structure NSS on the fin active region FA. For example, the gate line 160 may surround four surfaces of each of the plurality of nano-sheets N1, N2, and N3 in a gate all around (GAA) structure. Here, the four surfaces may include the top surface, the bottom surface, and both side surfaces in the second direction Y of a nano-sheet.

The gate line 160 may include the outer metal gate 160Mo and the inner metal gate 160Mi. The outer metal gate 160Mo may cover the top surface of the nano-sheet structure NSS and extend in the second direction Y. Also, the outer metal gate 160Mo may cover a portion of the device isolation layer 114. The inner metal gate 160Mi may be integrally connected to the outer metal gate 160Mo and may be disposed between two nano-sheets adjacent to each other in the third direction Z, and between the fin active region FA and the first nano-sheet N1. In the third direction Z, the thickness of each of a plurality of inner metal gates 160Mi may be less than the outer metal gate 160Mo. Also, in the first direction X, end positions of the inner metal gate 160Mi and end positions of the outer metal gate 160Mo may be similar to each other or have a difference of 5 nm or less.

The gate line 160 may include a metal, a metal nitride, a metal carbide, or a combination thereof. The metal may include any one from among titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dyprosium (Dy), erbium (Er), and palladium (Pd). The metal nitride may include, for example, any one of titanium nitride (TiN) and tantalum nitride (TaN). The metal carbide may include, for example, titanium aluminum carbide (TiAlC). The gate dielectric layer 152 may be disposed between the nano-sheet structure NSS and the gate line 160. According to some embodiments, the gate dielectric layer 152 may include a stacked structure of an interfacial layer and a high-k layer. The interfacial layer may include a low-k material layer having a dielectric constant of about 9 or less, e.g., a silicon oxide layer, a silicon oxynitride layer, or a combination thereof. According to some embodiments, the interfacial layer may be omitted. The high-k layer may include a material having a higher dielectric constant than that of a silicon oxide layer. For example, the high-k film may have a dielectric constant from about 10 to about 25. The high-k layer may include hafnium oxide, but is not limited thereto.

A plurality of nano-sheet transistors TR may be formed in portions on the substrate 102 where the plurality of fin active regions FA and the plurality of gate lines 160 intersect with each other. According to some embodiments, the plurality of nano-sheets N1, N2, and N3 may include semiconductor layers of the same element. For example, the plurality of nano-sheets N1, N2, and N3 may each include a semiconductor layer of Si. The plurality of nano-sheets N1, N2, and N3 may be doped with a dopant having the same conductivity type as that of the source/drain region 130. For example, the plurality of nano-sheets N1, N2, and N3 may each include a semiconductor layer of Si doped with an n-type dopant. The n-type dopant may be P, As, Sb, or a combination thereof, but is not limited thereto.

The spacers 118 may be arranged on both sidewalls of each of the plurality of gate lines 160 on the fin active region FA and the device isolation layer 114. The spacers 118 may cover both sidewalls of the outer metal gate 160Mo on the top surface of the plurality of nano-sheet structures NSS. The spacer 118 may include an inner spacer 118a and an outer spacer 118b. The spacers 118 may each be spaced apart from the gate line 160 with the gate dielectric layer 152 therebetween. The spacer 118 may include silicon nitride (SiN$_x$), silicon dioxide (SiO$_2$), silicon carbon nitride (SiCN), silicon boron nitride (SiBN), silicon oxynitride (SiON), SiOCN, silicoboron carbonitride (SiBCN), SiOC, or a combination thereof.

As shown in FIGS. 2A and 2B, the source/drain regions 130 may each include a portion overlapping the spacer 118 in the third direction Z. For example, the portion of the source/drain region 130 overlapping the spacer 118 in the third direction Z may have a width of 4 nm or less in the first direction X. According to some embodiments, the spacer 118 may not overlap the inner impurity layer 134 and the central impurity layer 136 of the source/drain region 130 in the third direction Z. According to some embodiments, the spacer 118 may overlap the buffer layer 132, or may overlap the buffer layer 132 and the inner impurity layer 134 in the third direction Z.

Both sidewalls of the inner metal gate 160Mi in the first direction X disposed between two nano-sheets adjacent to each other in the third direction Z and between the fin active region FA and the first nano-sheet N1 may be spaced apart from the source/drain region 130 with the gate dielectric layer 152 therebetween. The gate dielectric layer 152 may contact the buffer layer 132 of the source/drain region 130. In embodiments, the inner metal gate 160Mi may be spaced apart from the top surfaces of the nano-sheets N1, N2, and N3 corresponding to the inner metal gate 160Mi and the top surface of the fin active region FA with gate dielectric layers 150, which are arranged on the top surface and the bottom surface of the inner metal gate 160Mi, therebetween.

As the buffer layer 132 is disposed in a deep indentation structure, a skew between the nano-sheets N1, N2, and N3 included in a channel region and the gate dielectric layer 152 surrounding the inner metal gate 160Mi may be 8 nm or greater. Here, the skew may refer to a distance between the positions of ends of the nano-sheets N1, N2, and N3 and the positions of ends of the gate dielectric layer 152 surrounding the inner metal gate 160Mi, in the first direction X.

As described above, the gate line 160, the gate dielectric layer 152, and the spacer 118 may be included in the gate structure GST. The gate structure GST may extend in the second direction Y on the fin active region FA and the device isolation layer 114. The source/drain region 130 may be arranged on the fin active region FA to be adjacent to both side surfaces of the gate structure GST in the first direction X-direction).

The source/drain region 130 may face the nano-sheet structure NSS and the inner metal gate 160Mi in the first direction X. The inner impurity layer 134 of the source/drain region 130 may be spaced apart from the inner metal gate 160Mi with the buffer layer 132 and the gate dielectric layer 152 therebetween. In other words, the buffer layer 132 of the source/drain region 130 may be between the inner impurity layer 134 and the gate dielectric layer 152. In embodiments, the inner impurity layer 134 of the source/drain region 130 may contact side surfaces of each of the plurality of nano-sheets N1, N2, and N3. Also, the buffer layer 132 may not be between the plurality of nano-sheets N1, N2, and N3 and the inner impurity layer 134.

FIG. 2C shows the relative positions and shapes of components on a plane at the position of the semiconductor device 100 at the first level LV1 according to embodiments. As shown in FIG. 2C, in the source/drain region 130, the buffer layer 132 may contact the gate dielectric layer 152 at a portion corresponding to the inner metal gate 160Mi.

At the first level LV1, the inner metal gate 160Mi may have a smaller width than the outer metal gate 160Mo in the first direction X. In the semiconductor device 100 according to embodiments, the thickness D1 of the buffer layer 132 may increase as much as the reduction in the width of the inner metal gate 160Mi. Therefore, the thickness D1 of the buffer layer 132 may be greater than the thickness D2 of the inner impurity layer 134 in the first direction X. Also, as shown in FIG. 2B, a width 136 W of the central impurity layer 136 in the first direction X may be equal to or smaller than the separation distance CPP between the plurality of gate lines 160 in the first direction X.

As shown in FIG. 2A, a protective insulation layer 142 may be disposed on the spacer 118 and the source/drain regions 130. The protective insulation layer 142 may include SiN$_x$, SiO$_2$, SiCN, SiBN, SiON, SiOCN, SiBCN, SiOC, or a combination thereof. According to some embodiments, the protective insulation layer 142 may be omitted.

An inter-gate insulation layer 144 and an interlayer insulation layer 174 may be sequentially arranged on the protective insulation layer 142. The inter-gate insulation layer 144 may include, for example, SiN$_x$, SiO$_2$, SiON, SiOCN, or a combination thereof. The interlayer insulation layer 174 may include, for example, SiO$_2$.

In embodiments, the semiconductor device 100 according to embodiments may include a metal silicide layer 182 formed on the source/drain region 130 and a contact plug 184. The contact plug 184 may be formed in a contact hole 180 penetrating through the interlayer insulation layer 174, the inter-gate insulation layer 144, and the protective insulation layer 142. A plurality of contact plugs 184 may be connected to the central impurity layer 136 of the source/drain region 130 through the metal silicide layer 182.

The metal silicide layer 182 may be formed by a silicide reaction between a portion of the capping layer 138 in the source/drain region 130 and a metal. For example, the metal silicide layer 182 may include titanium silicide. However, the material included in the metal silicide layer 182 is not limited to titanium silicide. According to some embodiments, the metal silicide layer 182 may be omitted.

The contact plug 184 may include a metal, a conductive metal nitride, or a combination thereof. For example, the contact plug 184 may include W, Cu, Al, Ti, Ta, TiN, TaN, an alloy thereof, or a combination thereof.

In the semiconductor device 100 as shown in FIGS. 1 and 2A to 2C, the central impurity layer 136 of the source/drain region 130 may apply stress (e.g., tensile stress) to the plurality of nano-sheets N1, N2, and N3 of the nano-sheet structure NSS. For example, as the concentration of P in the central impurity layer 136 increases, greater stress may be applied to the plurality of nano-sheets N1, N2, and N3, thereby improving the carrier mobility in the plurality of nano-sheets N1, N2, and N3.

In embodiments, the buffer layer 132, the inner impurity layer 134, and the capping layer 138 may protect the central impurity layer 136 included in the body of the source/drain region 130. For example, the buffer layer 132, the inner impurity layer 134, and the capping layer 138 may each prevent penetration of chemical substances to the central impurity layer 136 from the outside. Therefore, during a process of manufacturing the semiconductor device 100 according to embodiments, the central impurity layer 136 may be protected by the buffer layer 132, the inner impurity layer 134, and the capping layer 138 from an external attack or damage.

Also, the inner impurity layer 134 may have various shapes and thicknesses by overcoming the thickness limit due to the facet of an epitaxial growth layer. Therefore, even when the buffer layer 132 includes a facet, the inner impurity layer 134 may reinforce a weak portion of the buffer layer 132. Therefore, during the process of manufacturing the semiconductor device 100 according to embodiments, defects like degradation of main portions of the source/drain region 130 due to an external attack or a short circuit between the source/drain region 130 and a conductive region adjacent thereto (e.g., the gate line 160) may be suppressed, thereby improving the reliability of the semiconductor device 100.

Figure 3A:
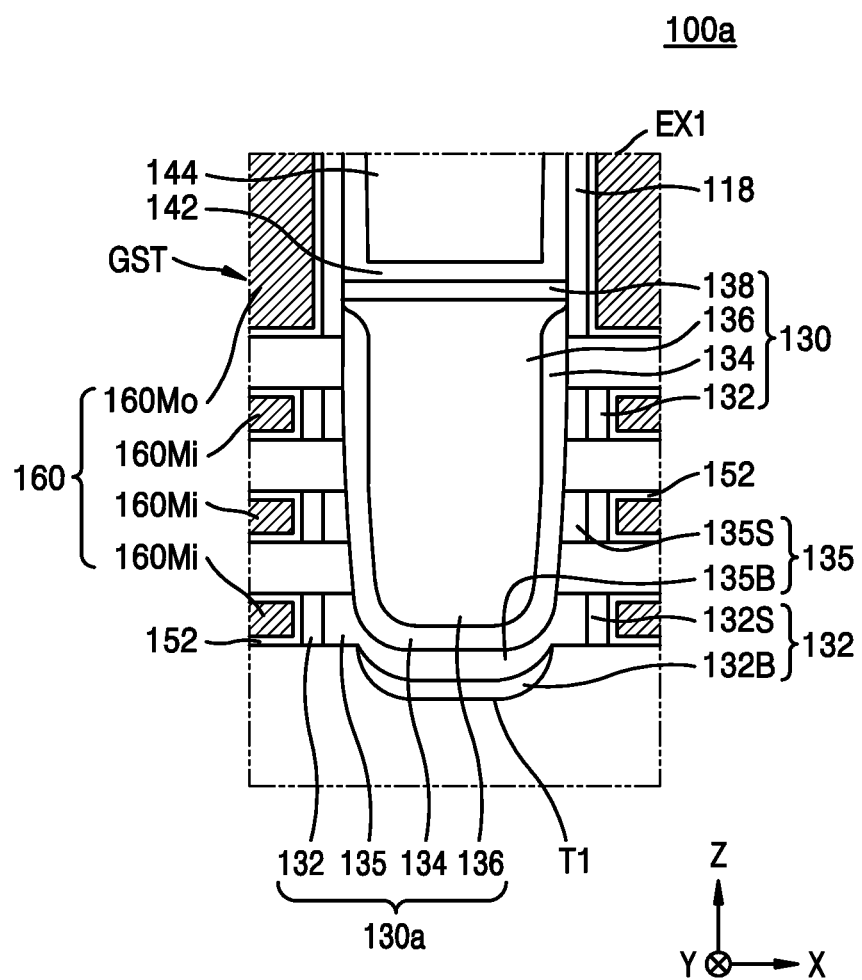
FIG. 3A is a cross-sectional view of a semiconductor device, and corresponds to an enlarged cross-sectional view of FIGS. 2B and 2C, according to an embodiment.
Figure 3B:
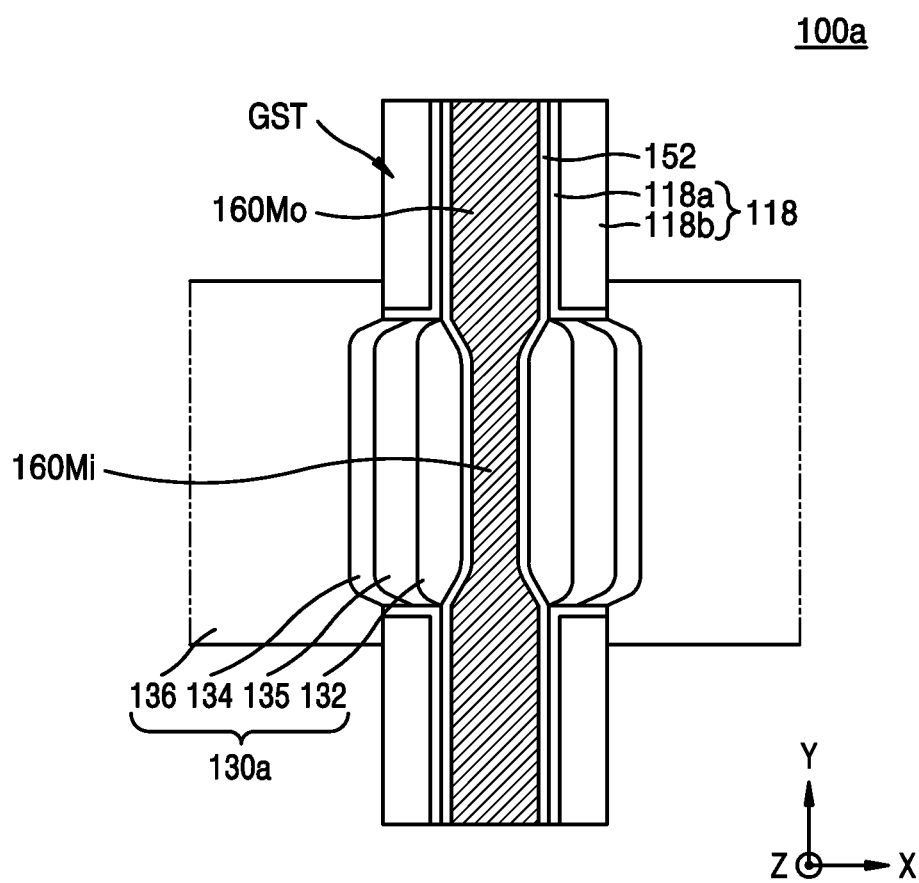
FIG. 3B is a plan view of a semiconductor device, and corresponds to an enlarged plan view of FIG. 2C, according to an embodiment.

FIGS. 3A and 3B are a cross-sectional view and a plan view of a semiconductor device according to an embodiment and correspond to an enlarged cross-sectional view and an enlarged plan view of FIGS. 2B and 2C, respectively. Redundant descriptions of elements already described above with reference to FIGS. 1 to 2C may be briefly given or omitted.

Referring to FIGS. 3A and 3B, a semiconductor device 100a according to embodiments may be different from the semiconductor device 100 of FIG. 2A in the structure of a source/drain region 130a. For example, in the semiconductor device 100a according to embodiments, the source/drain region 130a may include the buffer layer 132, the inner impurity layer 134, an outer impurity layer 135, and the central impurity layer 136. In other words, the source/drain region 130a of the semiconductor device 100a according to embodiments may further include the outer impurity layer 135 as compared to the source/drain region 130 of the semiconductor device 100 of FIG. 2A. Therefore, except for the thickness of the buffer layer 132, the buffer layer 132, the inner impurity layer 134, and the central impurity layer 136 may be the same as or substantially similar to those described above in the descriptions of FIGS. 1 to 2C.

The outer impurity layer 135 may include a side portion 135S and a bottom portion 135B, similar to the buffer layer 132. The side portion 135S of the outer impurity layer 135 may be disposed as an indentation structure between two nano-sheets adjacent to each other in the third direction Z or between the first nano-sheet N1 and the top surface FT of the fin active region FA. For example, the side portion 135S of the outer impurity layer 135 may have a structure protruding from the inner impurity layer 134 in the first direction X, that is, a protrusion-like shape.

The bottom portion 135B of the outer impurity layer 135 may be disposed between the inner impurity layer 134 and the bottom buffer layer 132B and may cover the bottom surface of the inner impurity layer 134. The bottom surface of the bottom portion 135B of the outer impurity layer 135 may be substantially coplanar with the top surface of the fin active region FA or may be lower than the top surface of the fin active region FA. The thickness of the bottom portion 135B of the outer impurity layer 135 may be within the range from about 2 nm to about 10 nm. However, the thickness of the bottom portion 135B of the outer impurity layer 135 is not limited to the numerical range stated above.

In embodiments, the thickness of the side portion 135S of the outer impurity layer 135 may decrease upward. For example, a portion of the side portion 135S disposed adjacent to the uppermost inner metal gate 160Mi may have the smallest thickness, and a portion of the side portion 135S disposed adjacent to the lowermost inner metal gate 160Mi may have the largest thickness. However, according to embodiments, the thickness of the side portion 135S of the outer impurity layer 135 may be substantially constant regardless of the height.

In the semiconductor device 100a according to embodiments, because the source/drain region 130a further includes the outer impurity layer 135, the thickness of the buffer layer 132 may be reduced as much as the thickness of the outer impurity layer 135. For example, because the side buffer layer 132S of the buffer layer 132 and the side portion 135S of the outer impurity layer 135 are formed as indentation structures, the sum of the thickness of the side buffer layer 132S and the thickness of the side portion 135S of the outer impurity layer 135 in the first direction X may be similar to the thickness of the side buffer layer 132S in the first direction X in the source/drain region 130 of the semiconductor device 100 of FIG. 2C. However, according to some embodiments, as the width of the inner metal gate 160Mi decreases in the first direction X, the thickness of the side buffer layer 132S may increase.

The outer impurity layer 135 may include Si:C or SiGe:C. For example, in the case of Si:C, the concentration of C in the outer impurity layer 135 may be less than 0.5%. However, in the outer impurity layer 135 including Si:C, the concentration of C is not limited to the value stated above. The outer impurity layer 135 may be grown on the buffer layer 132.

Figure 4:
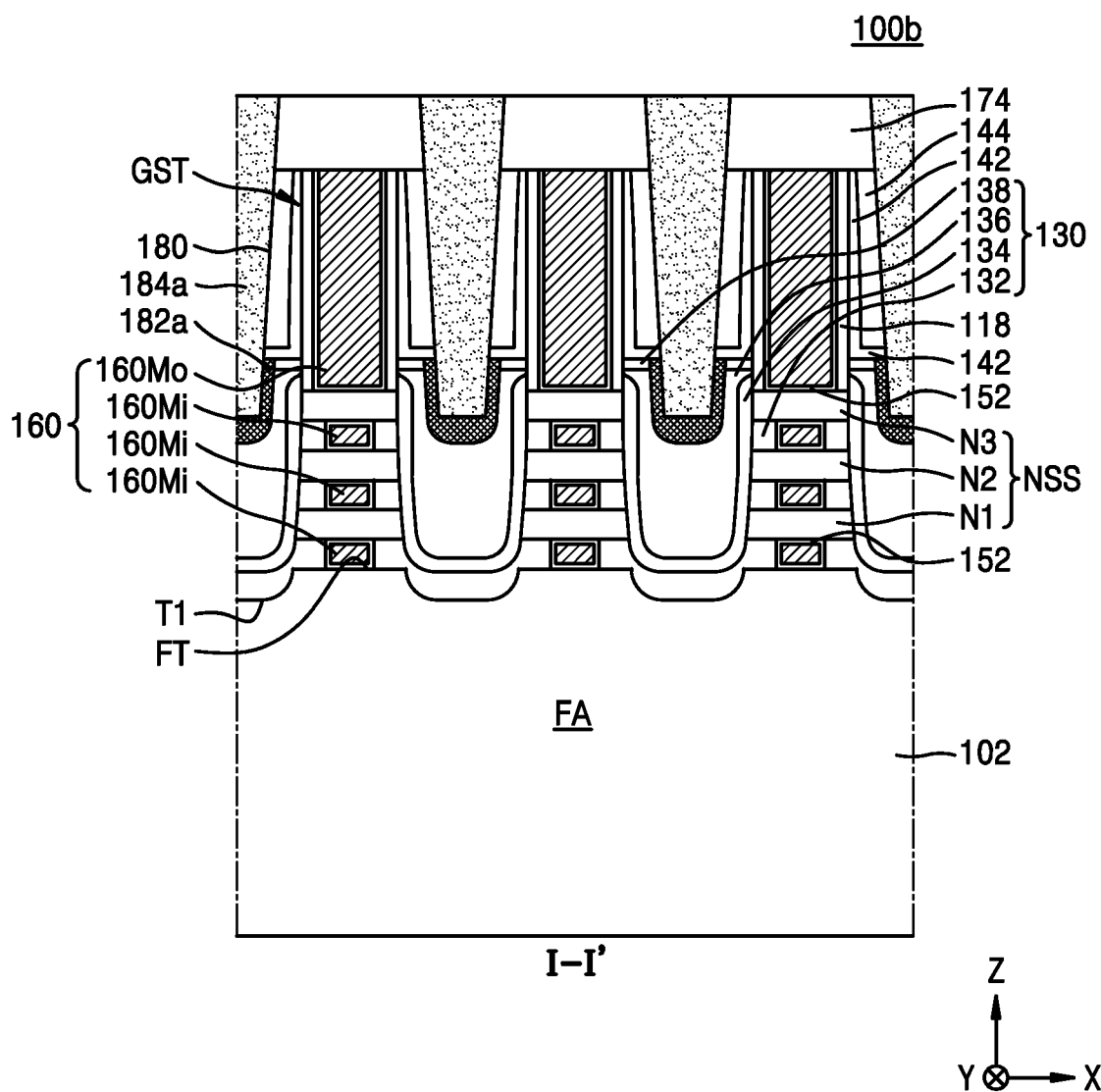
FIG. 4 is a cross-sectional view of a semiconductor device according to an embodiment.

FIG. 4 is a cross-sectional view of a semiconductor device according to an embodiment, which may correspond to FIG. 2A. Redundant descriptions of elements already described above with reference to FIGS. 1 to 2C may be briefly given or omitted.

Referring to FIG. 4, a semiconductor device 100b according to embodiments may have a structure similar to that of the semiconductor device 100 of FIG. 2A. However, the semiconductor device 100b according to embodiments may include a metal silicide layer 182a and a contact plug 184a having structures different from those of the semiconductor device 100 of FIG. 2A. For example, in the semiconductor device 100b according to embodiments, the bottom surface of the contact plug 184a may be lower than the top surface of the central impurity layer 136 included in the source/drain region 130. Also, a lower portion of the contact plug 184a may be surrounded by the metal silicide layer 182a.

The metal silicide layer 182a may be formed by a silicide reaction between respective portions of the capping layer 138 and the central impurity layer 136 in the source/drain region 130 and a metal. In the semiconductor device 100b according to embodiments, the metal silicide layer 182a may be omitted. In embodiments, materials included in the metal silicide layer 182a and the contact plug 184a may be the same as or substantially similar to those of the metal silicide layer 182 and the contact plug 184 of the semiconductor device 100 of FIG. 2A.

Figure 8:
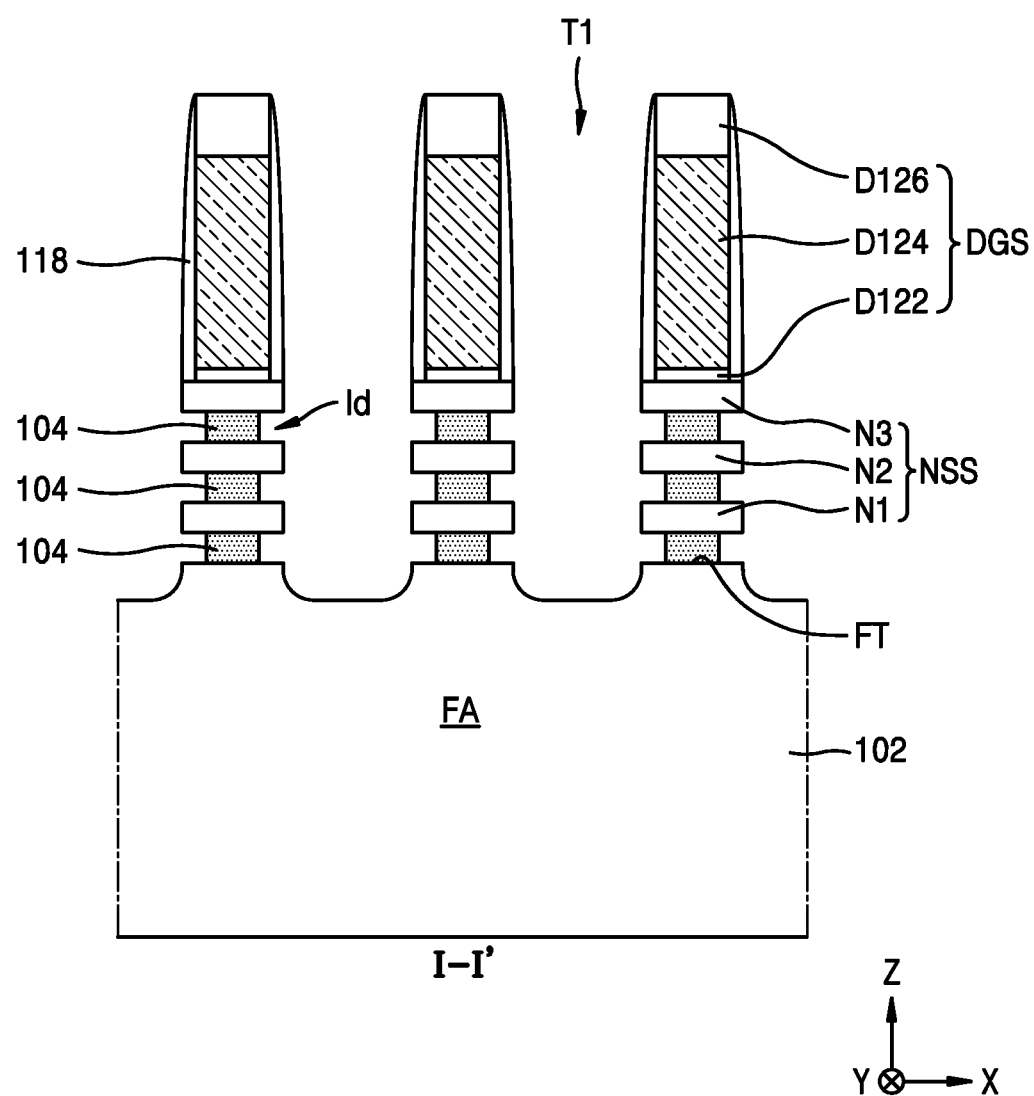
Figure 9:
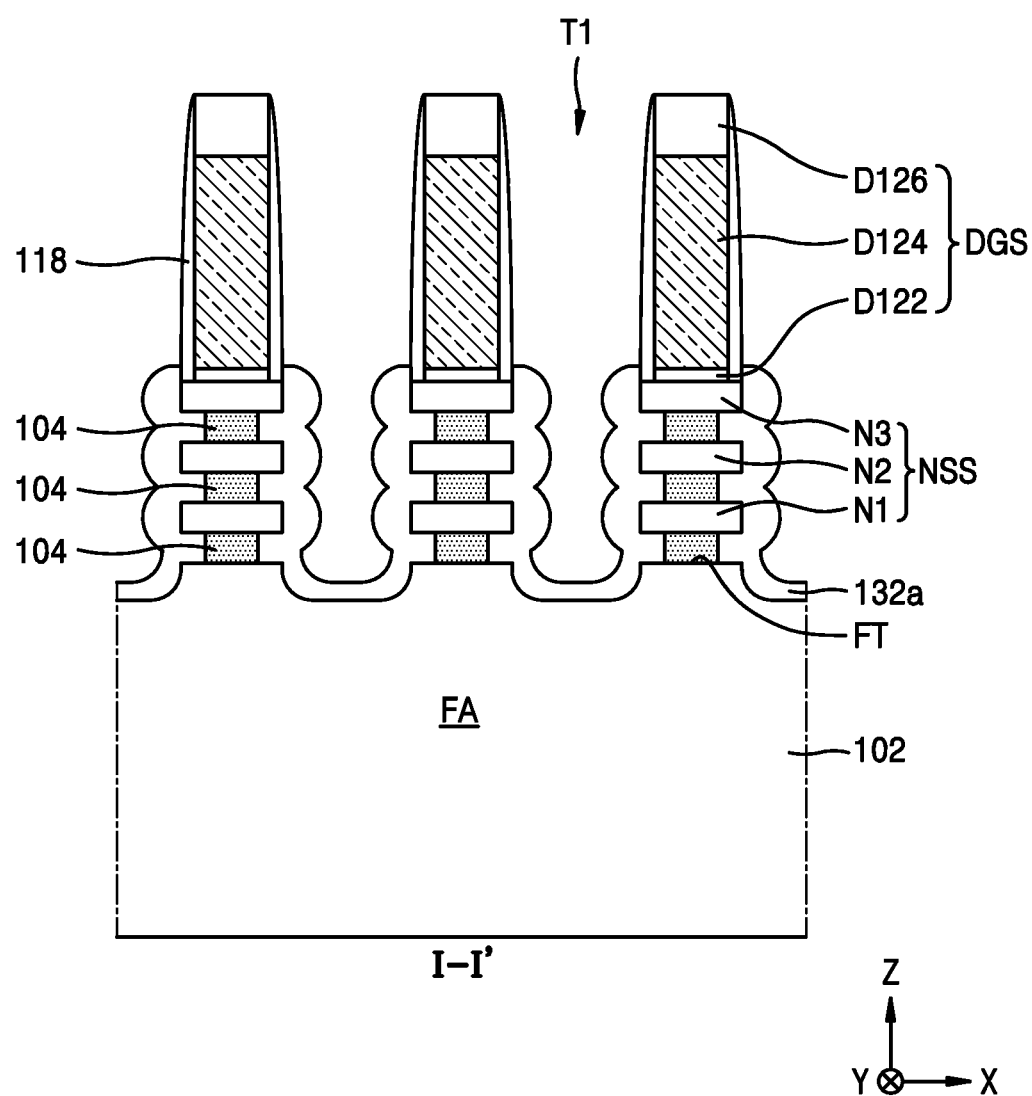
Figure 10:
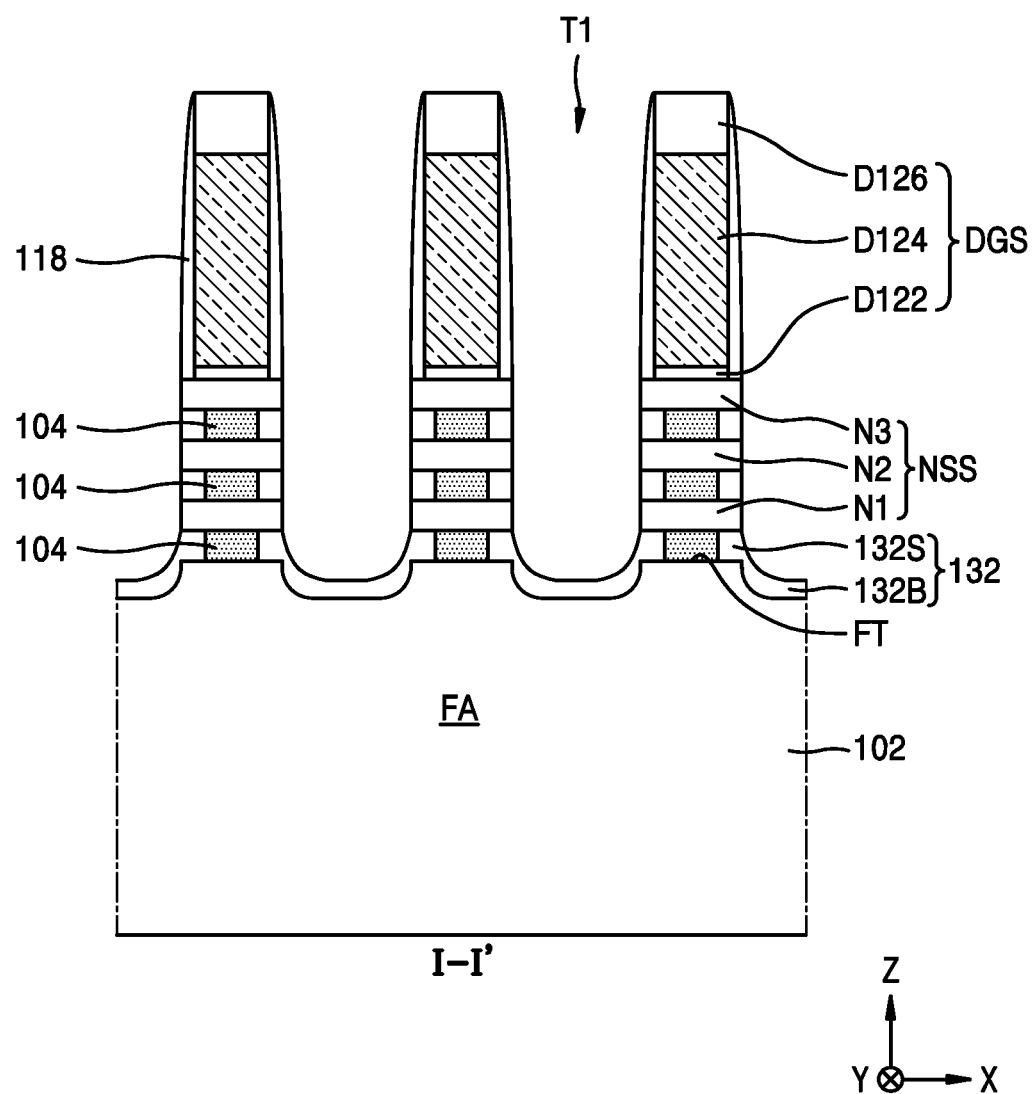
Figure 11A:
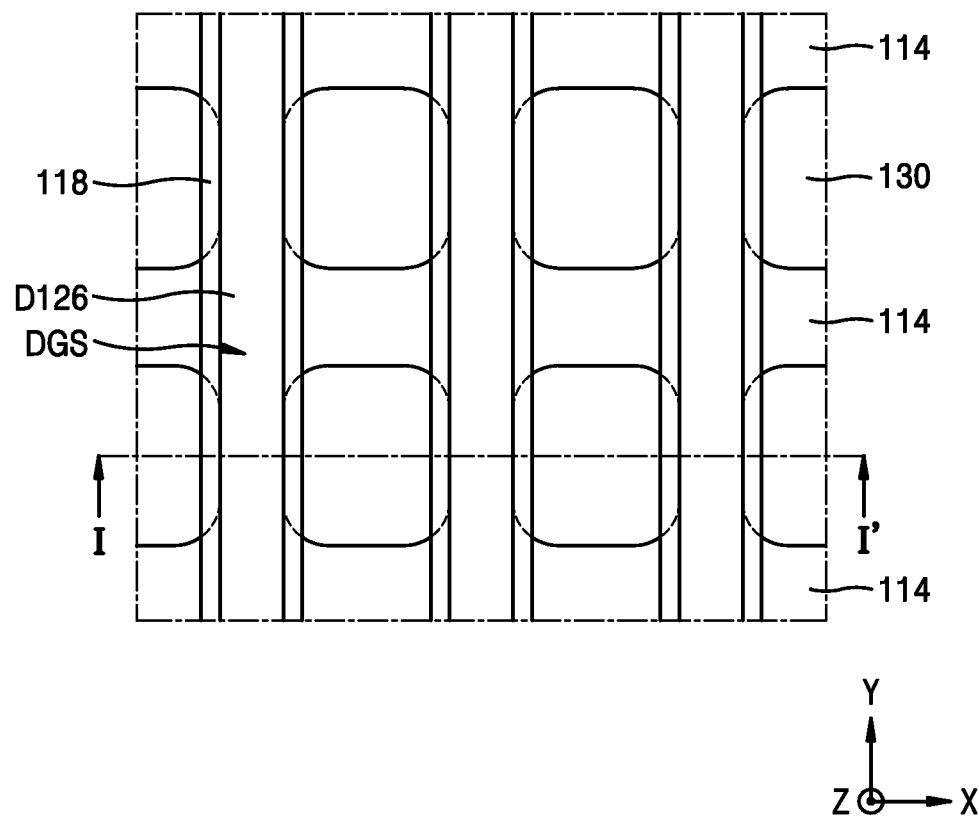
Figure 11B:
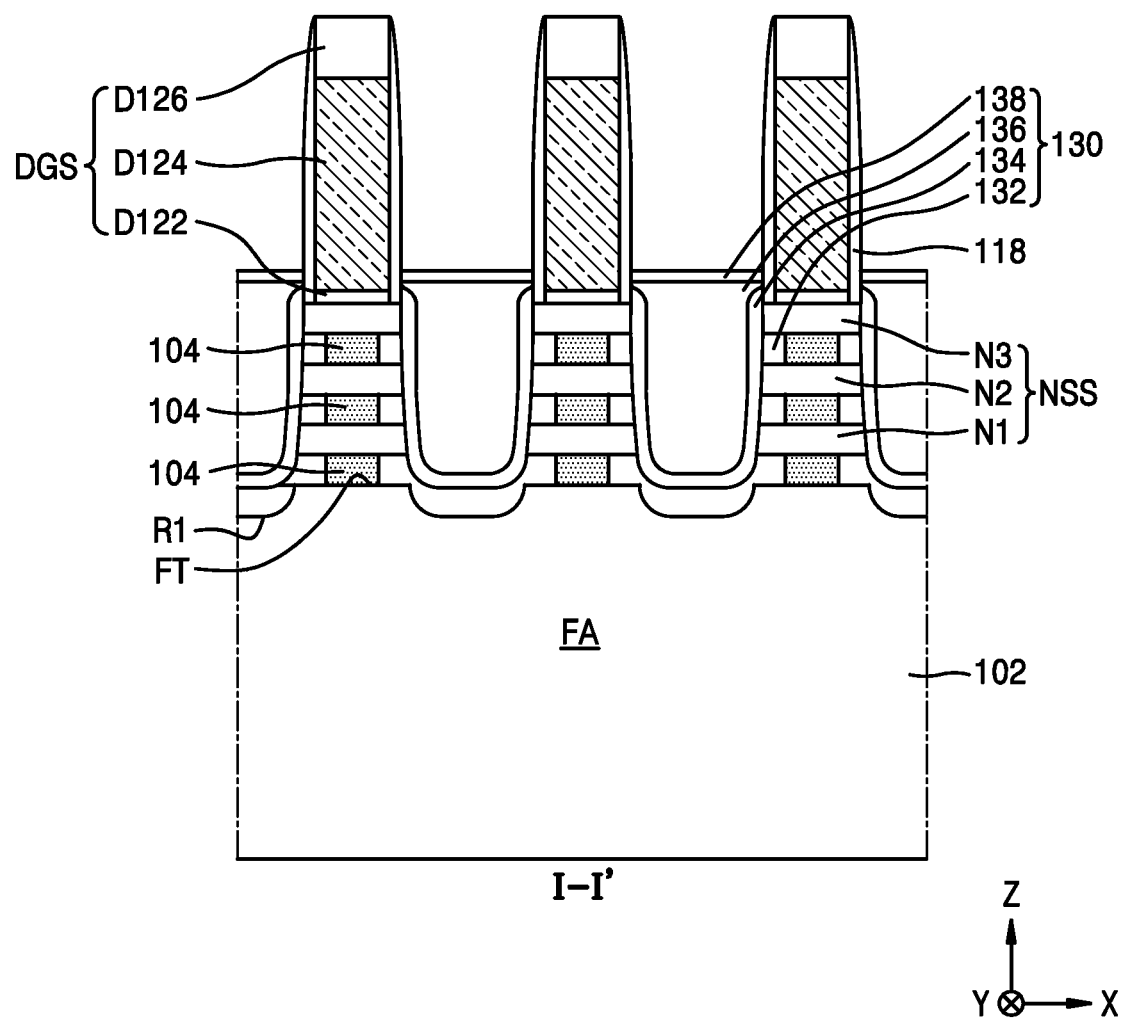
Figure 11C:
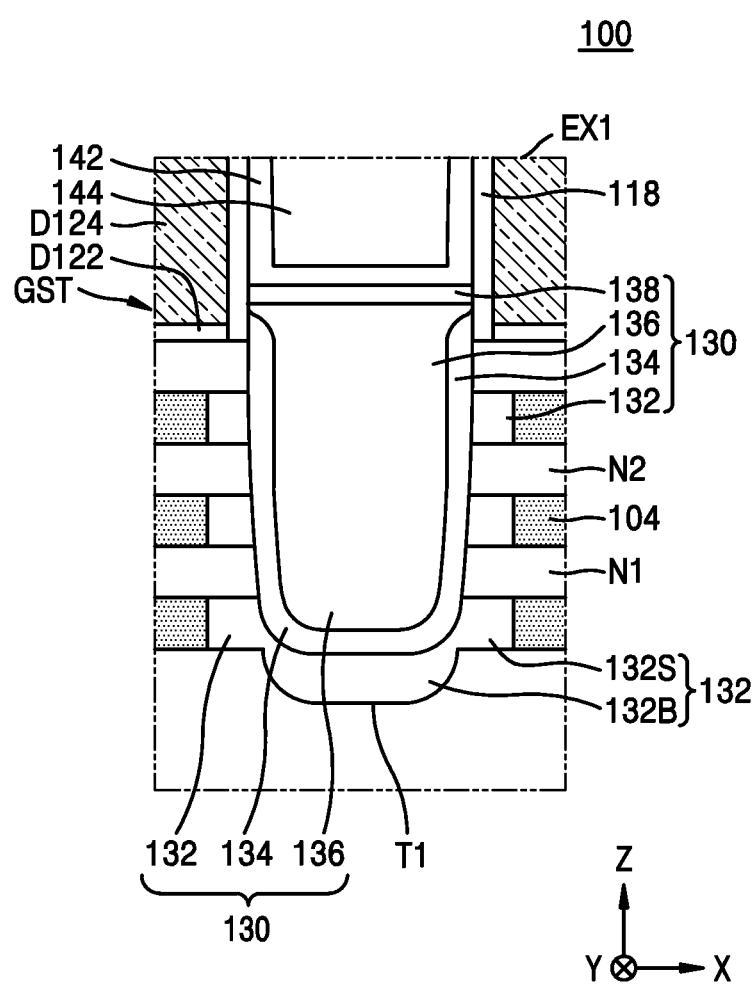
Figure 11D:
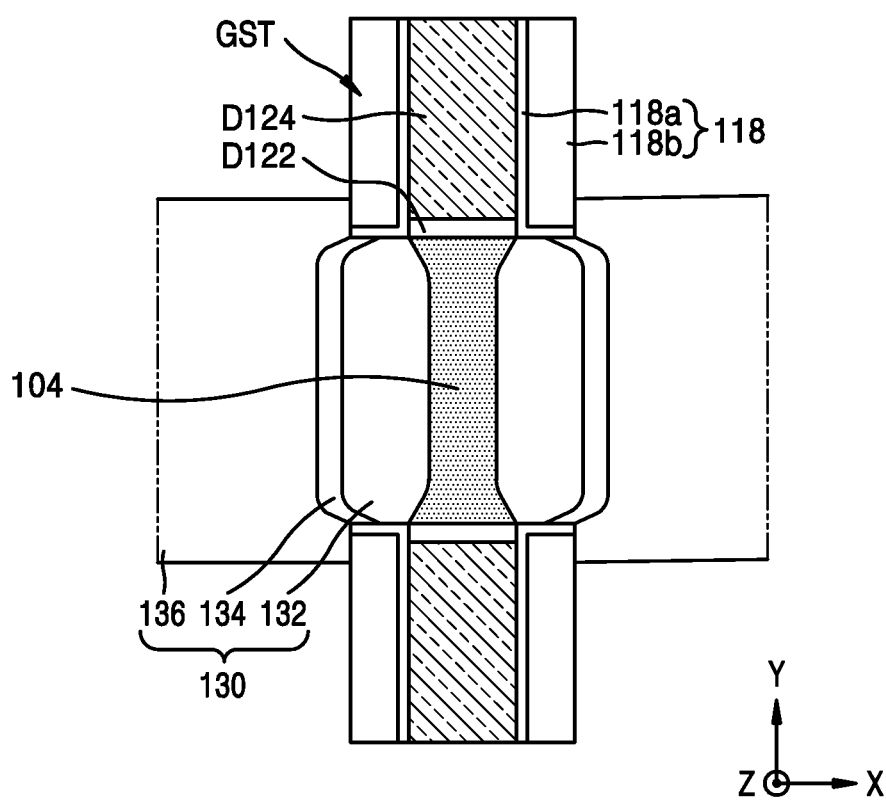

FIGS. 5A-5B, 6A-6B, 7A-7B, 8-10, 11A-11D, and 12-17 are plan views and cross-sectional views of a method of manufacturing a semiconductor device, according to an embodiment. FIGS. 5B, 6B, 7B, and 11B are cross-sectional views taken along a line I-I' of FIGS. 5A, 6A, 7A, and FIG. 11A, respectively, and FIGS. 11C and 11D are an enlarged cross-sectional view and an enlarged plan view of FIG. 11B and correspond to the enlarged cross-sectional view and the enlarged plan view of FIGS. 2B and 2C, respectively. Also, FIGS. 8-10 are cross-sectional views after the process of FIG. 7B, and FIGS. 12-17 are cross-sectional views after the process of FIG. 11B.

Figure 5A:
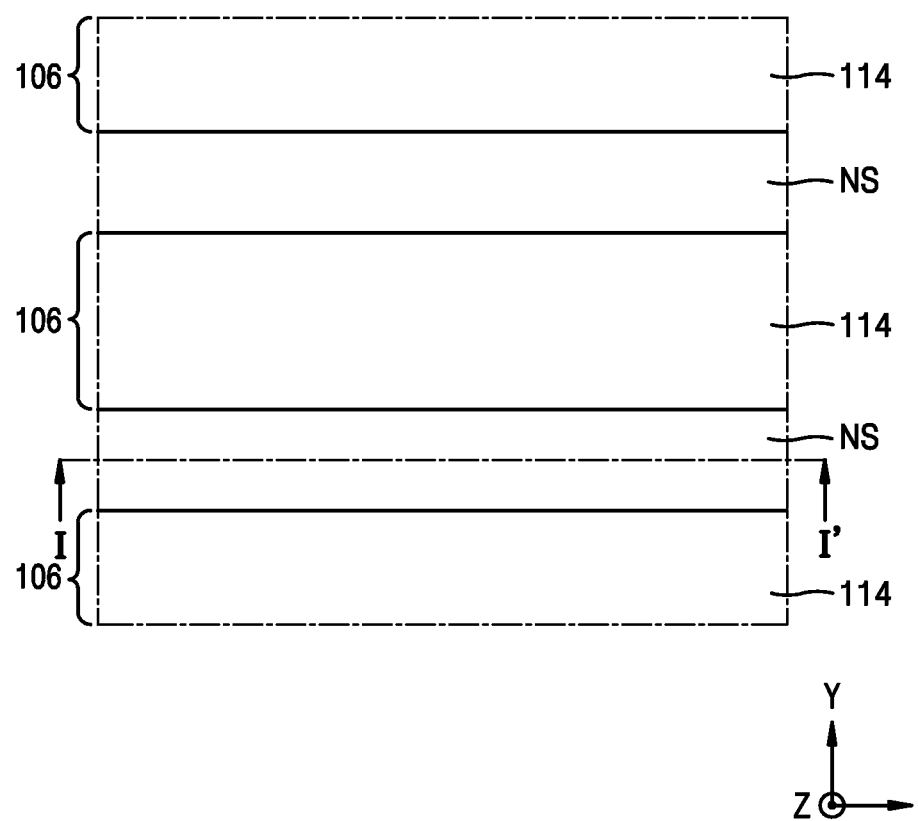
FIGS. 5A-5B, 6A-6B, 7A-7B, 8-10, 11A-11D, and 12-17 are cross-sectional views and plan views of a method of manufacturing a semiconductor device, according to an embodiment.
Figure 5B:
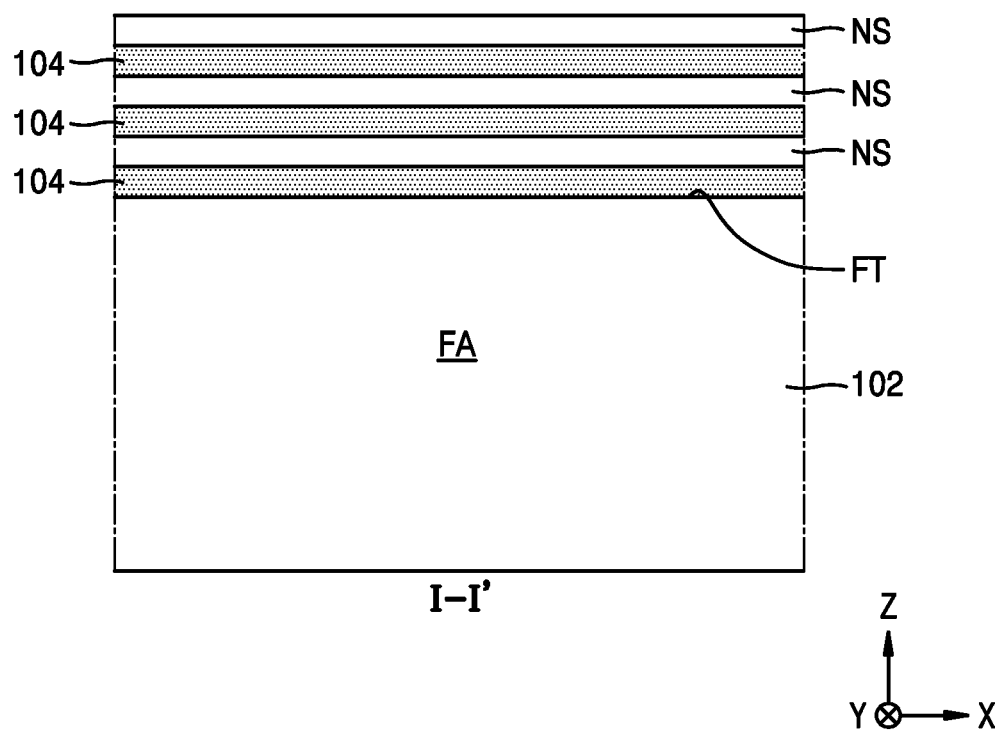

Referring to FIGS. 5A and 5B, in the method of manufacturing a semiconductor device, according to embodiments, first, a sacrificial semiconductor layer 104 and a nano-sheet semiconductor layer NS are alternately stacked on the substrate 102. Thereafter, the sacrificial semiconductor layer 104, the nano-sheet semiconductor layer NS, and a portion of the substrate 102 are etched to form a device isolation trench 106. The plurality of fin active regions FA may be defined in the substrate 102 by the device isolation trench 106. The plurality of fin active regions FA may extend in the first direction X and may be spaced apart from one another in the second direction Y. Subsequently, the device isolation layer 114 is formed by filling the device isolation trench 106 with an insulation material. The top surface of the device isolation layer 114 may be the same as or substantially similar to top surfaces FT of the fin active regions FA.

The sacrificial semiconductor layer 104 and the nano-sheet semiconductor layer NS alternately stacked may be maintained on the top surfaces FT of the fin active regions FA. The sacrificial semiconductor layer 104 and the nano-sheet semiconductor layer NS may include semiconductor materials having different etch selectivity. According to some embodiments, the nano-sheet semiconductor layer NS may include Si, and the sacrificial semiconductor layer 104 may include SiGe. According to some embodiments, the concentration of Ge in the sacrificial semiconductor layer 104 may be constant. For example, the sacrificial semiconductor layer 104 including SiGe may have a constant concentration of Ge within the range from 5% to 60% or from 10% to 40%. However, the concentration of Ge included in the sacrificial semiconductor layer 104 including SiGe is not limited to the numerical range stated above. For example, in the method of manufacturing a semiconductor device, according to embodiments, the concentration of Ge included in the sacrificial semiconductor layer 104 including SiGe may be variously changed as needed.

Figure 6A:
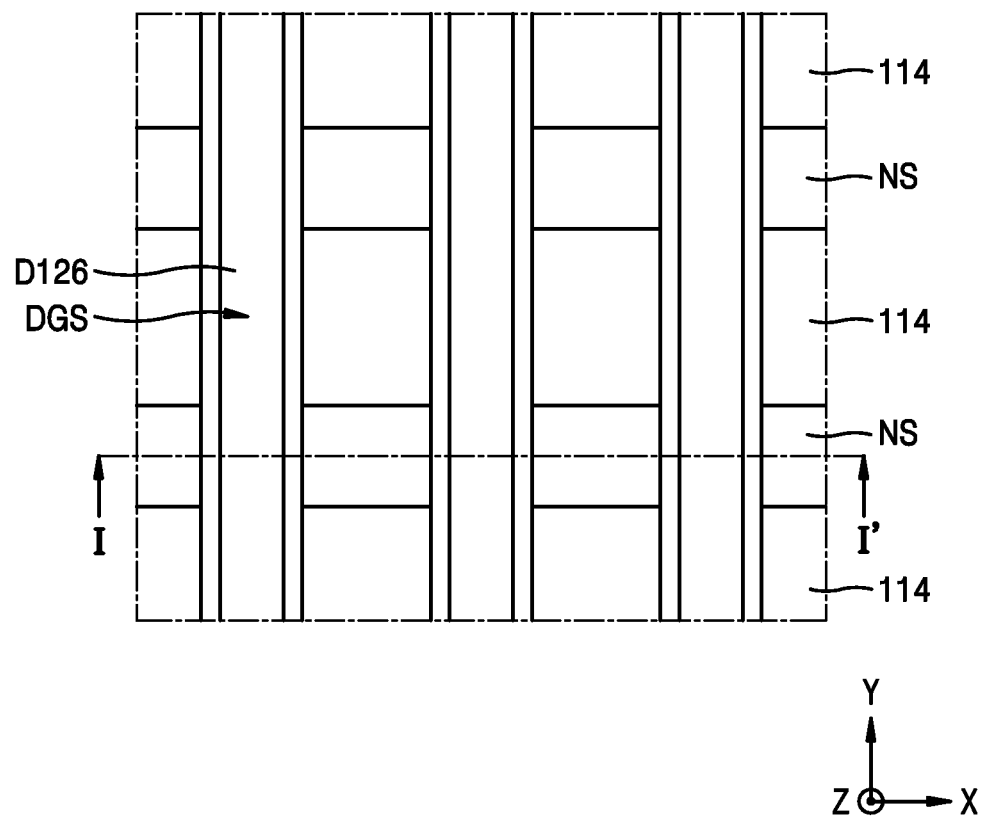
Figure 6B:
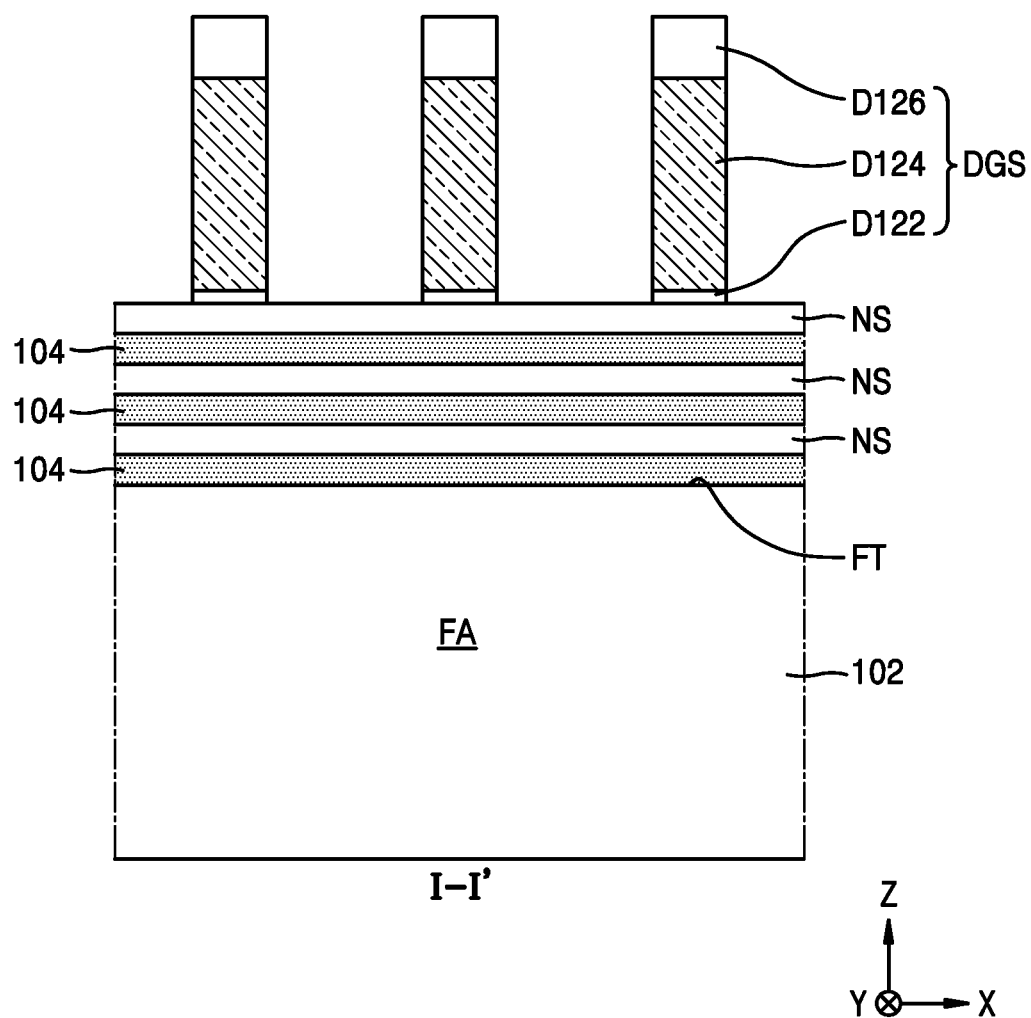

Referring to FIGS. 6A and 6B, a plurality of dummy gate structures DGS are formed on the stacked structure of the sacrificial semiconductor layer 104 and the nano-sheet semiconductor layer NS maintained on the fin active regions FA. The plurality of dummy gate structures DGS may extend in the second direction Y and may be spaced apart from one another in the first direction X. The dummy gate structure DGS may include an oxide layer D122, a dummy gate layer D124, and a dummy capping layer D126 that are sequentially stacked. According to some embodiments, the dummy gate layer D124 may include polysilicon, and the dummy capping layer D126 may include $SiN_x$.

Figure 7A:
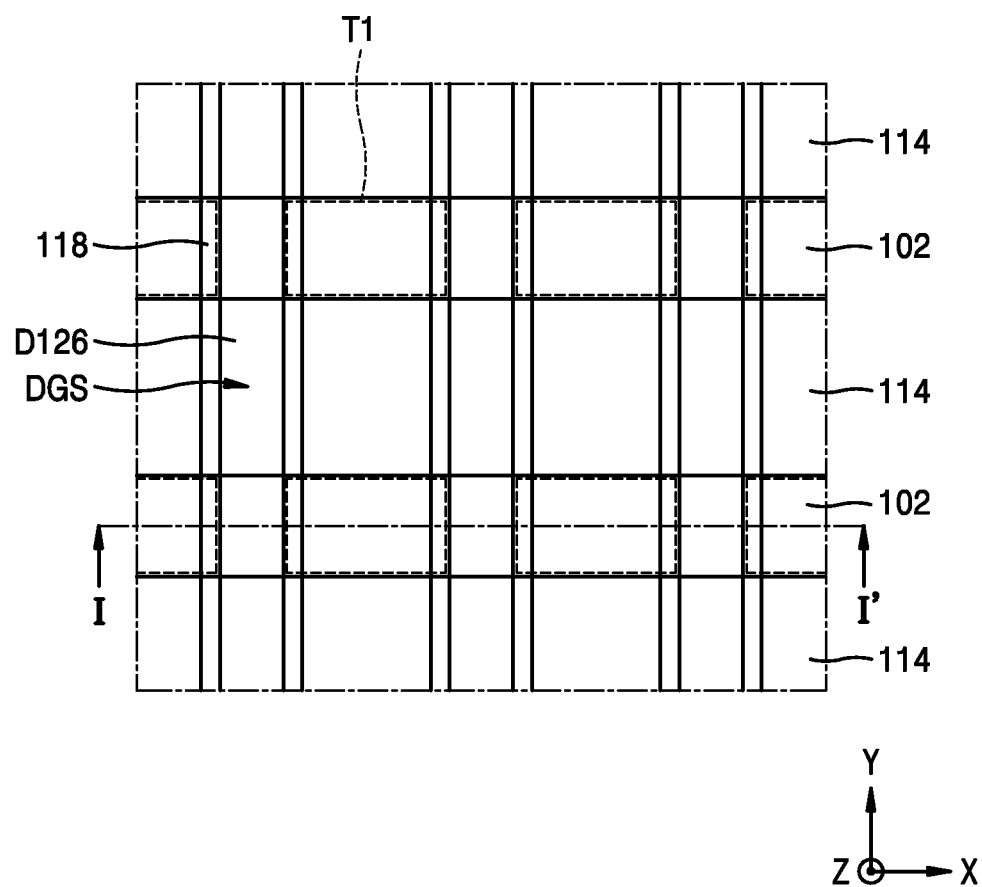
Figure 7B:
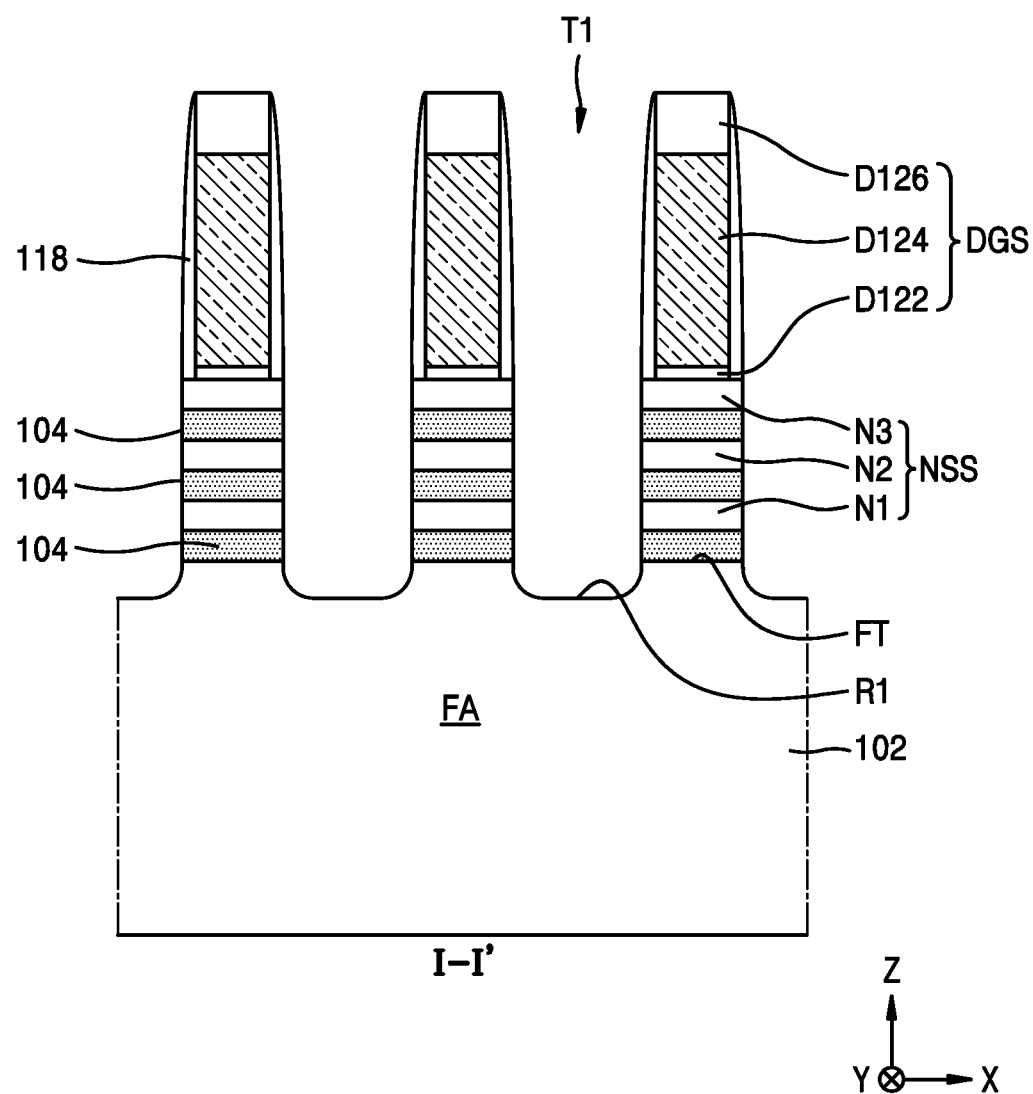

Referring to FIGS. 7A and 7B, the spacers 118 covering both sidewalls of each of the plurality of dummy gate structures DGS are formed. Thereafter, the stacked structure of the sacrificial semiconductor layer 104 and the nano-sheet semiconductor layer NS is etched by using the dummy gate structure DGS and the spacer 118 as an etching mask, thereby forming the first trench T1. The nano-sheet semiconductor layer NS may be divided into the plurality of nano-sheet structures NSS through the first trench T1. The plurality of nano-sheet structures NSS may each include the plurality of nano-sheets N1, N2, and N3.

Subsequently, an upper portion of the fin active region FA exposed between the plurality of nano-sheet structures NSS is etched to form the recess R1 in the upper portion of the fin active region FA. To form the recess R1, dry etching, wet etching, or a combination thereof may be performed on the fin active region FA. Here, the recess R1 refers to only a portion formed in the fin active region FA. The first trench T1 may include the recess R1 and may be defined from the top surface of the nano-sheet structure NSS to the bottom surface of the recess R1. As shown in FIG. 7B, the cross-sectional shape of the first trench T1 including the recess R1 may have a substantially rectangular shape extending in the third direction Z.

Referring to FIG. 8, after the plurality of nano-sheet structures NSS are formed, portions of a plurality of sacrificial semiconductor layers 104 exposed through the first trench T1 are removed, thereby forming a plurality of indentation regions Id between nano-sheets adjacent to each other in the third direction Z and between the first nano-sheet N1 and the fin active region FA.

To form the indentation regions Id, portions of the plurality of sacrificial semiconductor layers 104 may be selectively etched by using a difference in etch selectivity between the plurality of sacrificial semiconductor layers 104 and the plurality of nano-sheets N1, N2, and N3.

In embodiments, the indentation regions Id may be formed to a sufficient depth considering the thickness of the buffer layer 132 to be formed later. For example, the depth of the indentation regions Id in the first direction X may be about 10 nm. However, the depth of the indentation regions Id is not limited to the value stated above.

Referring to FIG. 9, a buffer layer 132a is formed in the first trench T1. The buffer layer 132a may be formed through a selective epitaxial growth. Therefore, the buffer layer 132a may not grow on a dielectric layer like a $SiN_x$ layer or a $SiO_2$ layer, but only on the fin active region FA, the nano-sheet structure NSS, and the sacrificial semiconductor layer 104 including Si. The buffer layer 132a may be formed to a thickness sufficient to fill the indentation regions Id. For example, the buffer layer 132a may be formed to a thickness of 10 nm or greater. As described above, the buffer layer 132a may include undoped Si or SiGe. When the buffer layer 132a includes SiGe, the concentration of Ge may be less than 5%.

Referring to FIG. 10, after the buffer layer 132a is formed, a portion of the buffer layer 132a grown on side surfaces of the nano-sheet structure NSS is removed through an etch-back process. By removing the portion of the buffer layer 132a on the side surfaces of the nano-sheet structure NSS, the side surfaces of the nano-sheet structure NSS may be exposed. Therefore, the buffer layer 132 including the side buffer layer 132S and the bottom buffer layer 132B may be formed. In embodiments, in the etch-back process, the thickness of a lower portion of the buffer layer 132a may be reduced. Therefore, the bottom buffer layer 132B of the buffer layer 132 may have a thickness of 10 nm or less.

Referring to FIGS. 11A-11D, after the buffer layer 132 is formed, an epitaxial layer may be grown in the trench T1 and the trench T1 may be filled with the epitaxial layer, thereby forming the source/drain region 130 on portions of the fin active region FA of both sides of the nano-sheet structure NSS. To form the source/drain regions 130, the inner impurity layer 134, the central impurity layer 136, and the capping layer 138 are sequentially formed in the first trench T1 in which the buffer layer 132 is formed. For example, to form the source/drain region 130, a semiconductor material may be epitaxially grown from the bottom buffer layer 132B on the bottom surface of the first trench T1, the sidewalls of the plurality of nano-sheets N1, N2, and N3, and the side buffer layer 132S.

According to some embodiments, to form the source/drain region 130, a low-pressure chemical vapor deposition (LPCVD) process, a selective epitaxial growth (SEG) process, or a cyclic deposition and etching (CDE) process may be performed using raw materials including an elemental semiconductor precursor. The elemental semiconductor precursor may include an element like Si and Ge.

In the formation of the source/drain regions 130, silane ($SiH_4$), trichlorosilane ($SiHCl_3$), disilane ($Si_2H_6$), trisilane ($Si_3H_8$), dichlorosilane ($SiH_2Cl_2$), etc. may be used as a Si source to form the inner impurity layer 134 or the central impurity layer 136. However, the Si source is not limited to the materials stated above. Also, as materials to be doped into the inner impurity layer 134 or the central impurity layer 136, various gaseous or liquid dopant materials may be used. In embodiments, for selective epitaxial growth, an etchant gas like hydrochloric acid (HCl) or chlorine ($Cl_2$) may be used.

As described above, the inner impurity layer 134 may include Si doped with P, As, Sb, etc., and the central impurity layer 136 may include silicon phosphide (SiP) densely doped with P. For example, in the central impurity layer 136 including SiP, the concentration of P may be within the range from 4% to 12%.

In the epitaxial growth process for forming the inner impurity layer 134 of the source/drain region 130, by controlling process conditions like the temperature, pressure, type of Si source, and the flow rate of a supply gas or adding a process like etch-back or chemical treatment during or after the epitaxial growth process, formation of a facet in the inner impurity layer 134 may be suppressed. Also, a desired portion of the inner impurity layer 134, e.g., a portion of the inner impurity layer 134 that is adjacent to the spacer 118 or a portion of the inner impurity layer 134 that covers a weak portion of the buffer layer 132, may be formed to have a relatively large thickness.

During the formation of the inner impurity layer 134, the inner impurity layer 134 may be formed, such that the thickness H2 of the bottom portion of the inner impurity layer 134 is greater than the thickness H1 of the bottom buffer layer 132B of the buffer layer 132 and at least a portion of the top surface of the bottom portion of the inner impurity layer 134 extends flat in a horizontal direction, e.g., the first direction X and/or the second direction Y. Also, the thickness H2 of the bottom portion of the inner impurity layer 134 may be greater than the thickness D2 of a portion of the inner impurity layer 134 in the first direction X facing the nano-sheet structure NSS. Because the bottom portion of the inner impurity layer 134 is formed to have a relatively large thickness H2, when the central impurity layer 136 is formed on the inner impurity layer 134, the first trench T1 remaining on the inner impurity layer 134 may be effectively filled with the central impurity layer 136 without a void. Also, the bottom portion of the inner impurity layer 134 having the relatively large thickness H2 may contribute to increasing the volume of the central impurity layer 136 in the first trench T1.

The structures shown in FIGS. 11C and 11D may be substantially the same as or substantially similar to those of FIGS. 2B and 2C, except that, in FIGS. 11C and 11D, the dummy gate layer D124 including polysilicon and the oxide layer D122 may be included instead of the outer metal gate 160Mo of the gate line 160 and the gate dielectric layer 152 and the sacrificial semiconductor layer 104 may be disposed instead of the inner metal gate 160Mi of the gate line 160 and the gate dielectric layer 152.

Also, after a buffer layer is formed to have a relatively small thickness, an outer impurity layer may be formed on the buffer layer to completely fill the indentation regions Id. Thereafter, portions of the buffer layer and the outer impurity layer grown on side surfaces of the nano-sheet structure NSS may be removed through an etch-back process. By removing the portions of the buffer layer and the outer impurity layer on the side surfaces of the nano-sheet structure NSS, the side surfaces of the nano-sheet structure NSS may be exposed. Thereafter, by forming the inner impurity layer 134 and the central impurity layer 136 on the outer impurity layer 135, the source/drain region 130a having the structure shown in FIG. 3A may be formed.

Figure 12:
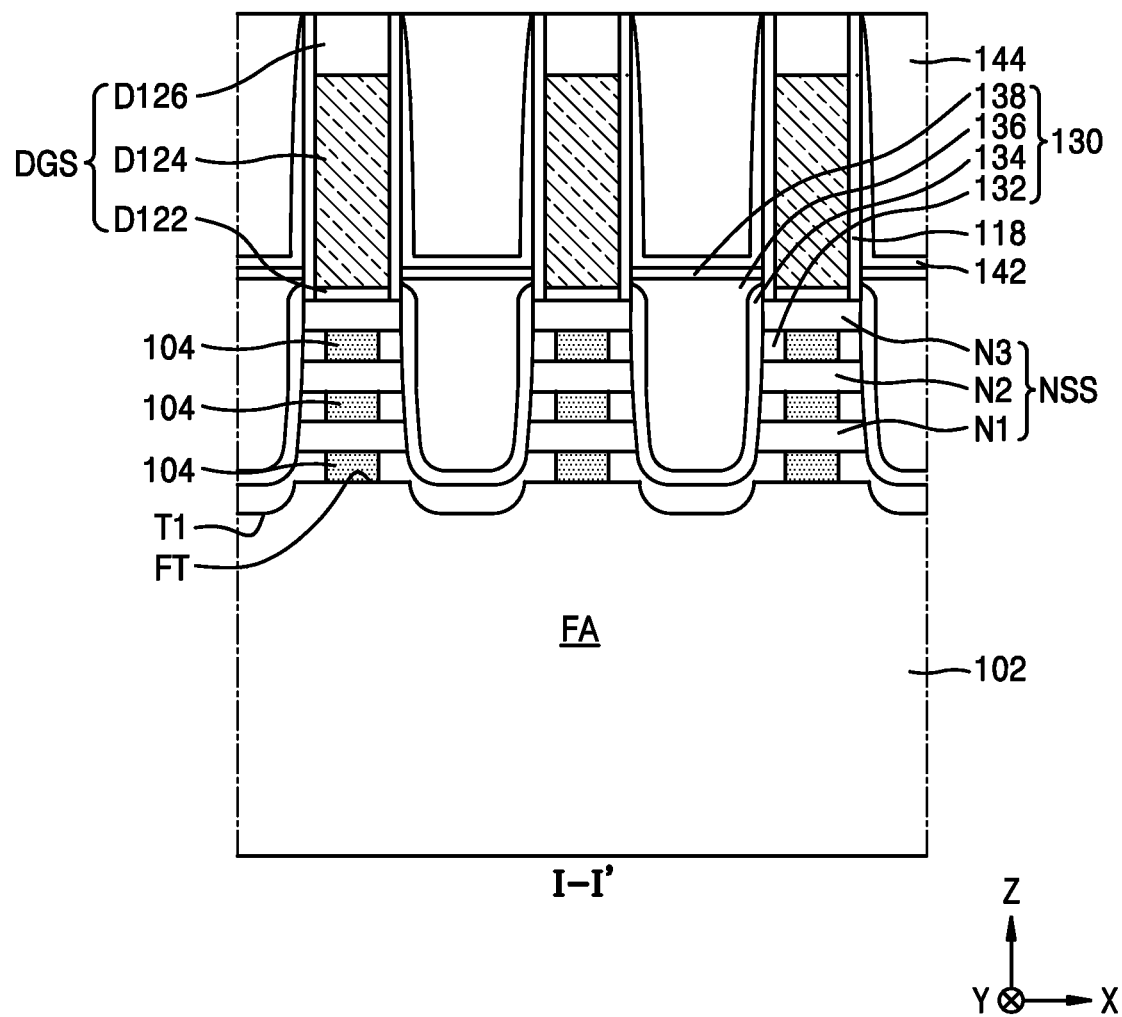

Referring to FIG. 12, the protective insulation layer 142 is formed to cover a resultant product in which the source/drain regions 130 are formed, and the inter-gate insulation layer 144 is formed on the protective insulation layer 142. Thereafter, the protective insulation layer 142 and the inter-gate insulation layer 144 are planarized to expose the top surface of the dummy capping layer D126.

Figure 13:
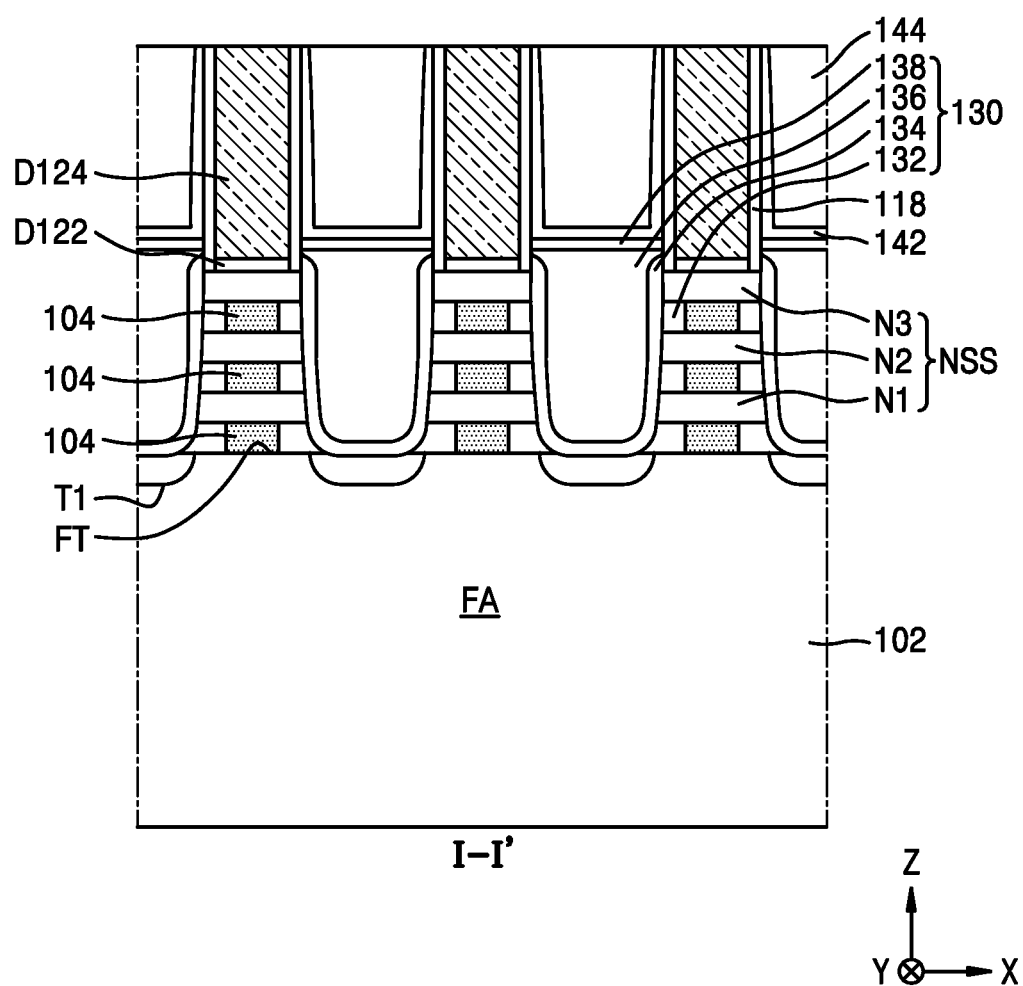

Referring to FIG. 13, upper portions of the protective insulation layer 142 and the inter-gate insulation layer 144 and the dummy capping layer D126 are removed through a planarization process to expose the top surface of the dummy gate layer D124. After the process of planarizing the dummy capping layer D126, the top surface of the inter-gate insulation layer 144 and the top surface of the dummy gate layer D124 may have substantially the same height.

Figure 14:
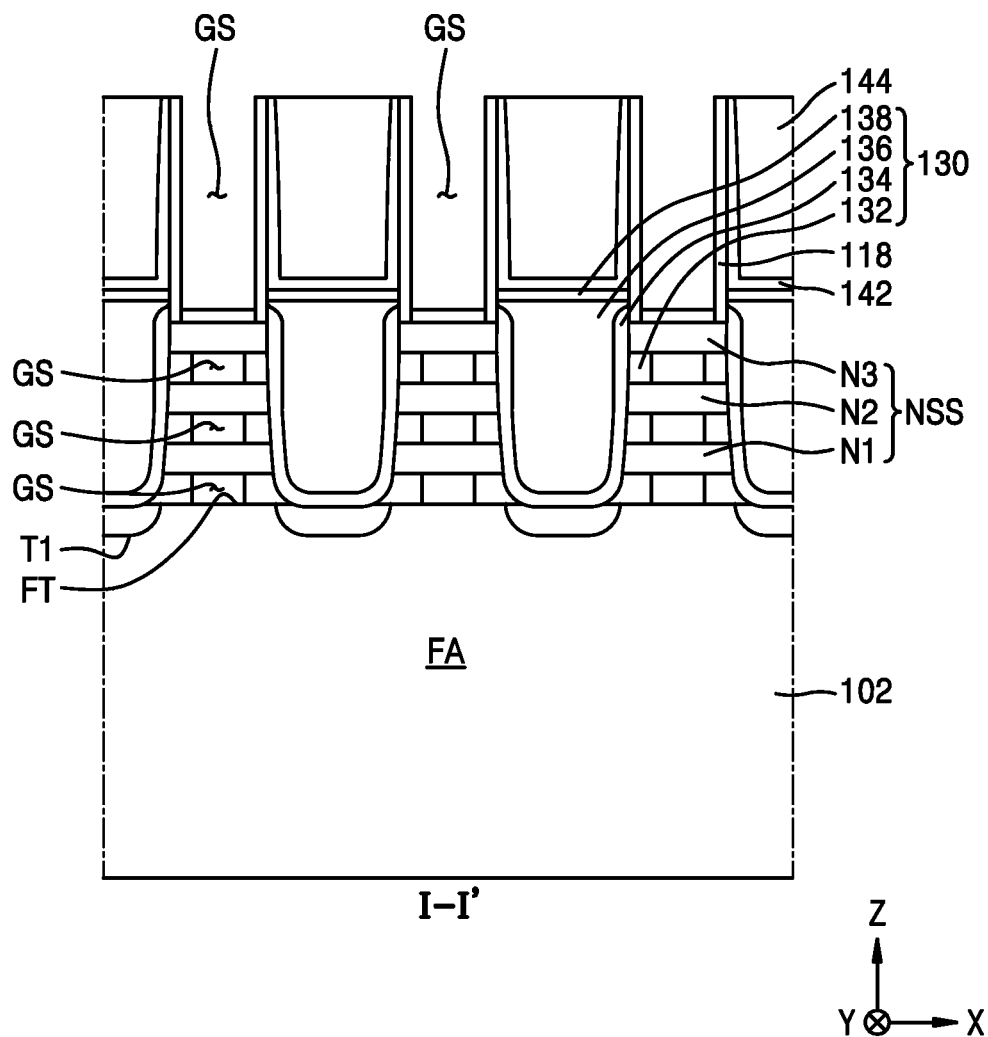

Referring to FIG. 14, a gate space GS is formed by removing the dummy gate layer D124 and the oxide layer D122 below the dummy gate layer D124, and the plurality of nano-sheet structures NSS are also exposed through the gate space GS. Subsequently, the plurality of sacrificial semiconductor layers 104 remaining on the fin active region FA are removed through the gate space GS, thereby extending the gate space GS to spaces between the nano-sheets N1, N2, and N3 adjacent to one another in the third direction Z and a space between the first nano-sheet N1 and the top surface FT of the fin active region FA.

According to some embodiments, to selectively remove the plurality of sacrificial semiconductor layers 104, a difference in etch selectivity between the plurality of nano-sheets N1, N2, and N3 and the plurality of sacrificial semiconductor layers 104 may be used. To selectively remove the plurality of sacrificial semiconductor layers 104, a liquid or gaseous etchant may be used. According to some embodiments, to selectively remove the plurality of sacrificial semiconductor layers 104, an acetic acid ($CH_3COOH$)-based etchant, e.g., an etchant including a mixture of CH$_3$COOH, nitric acid (HNO$_3$), and hydrogen fluoride (HF) or an etchant including a mixture of CH$_3$COOH, hydrogen peroxide (H$_2$O$_2$), and HF, may be used. However, the materials included in the etchant are not limited to the above-described materials.

Figure 15:
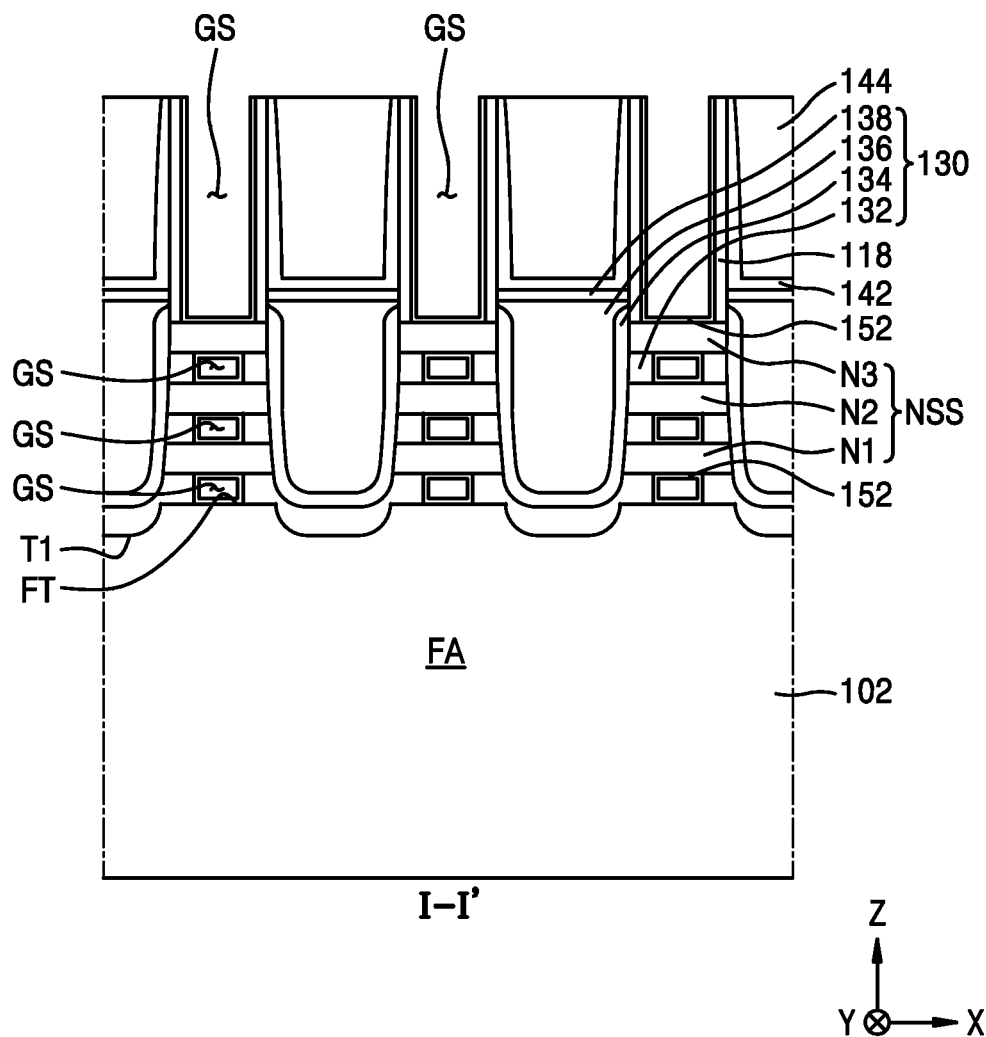
Figure 16:
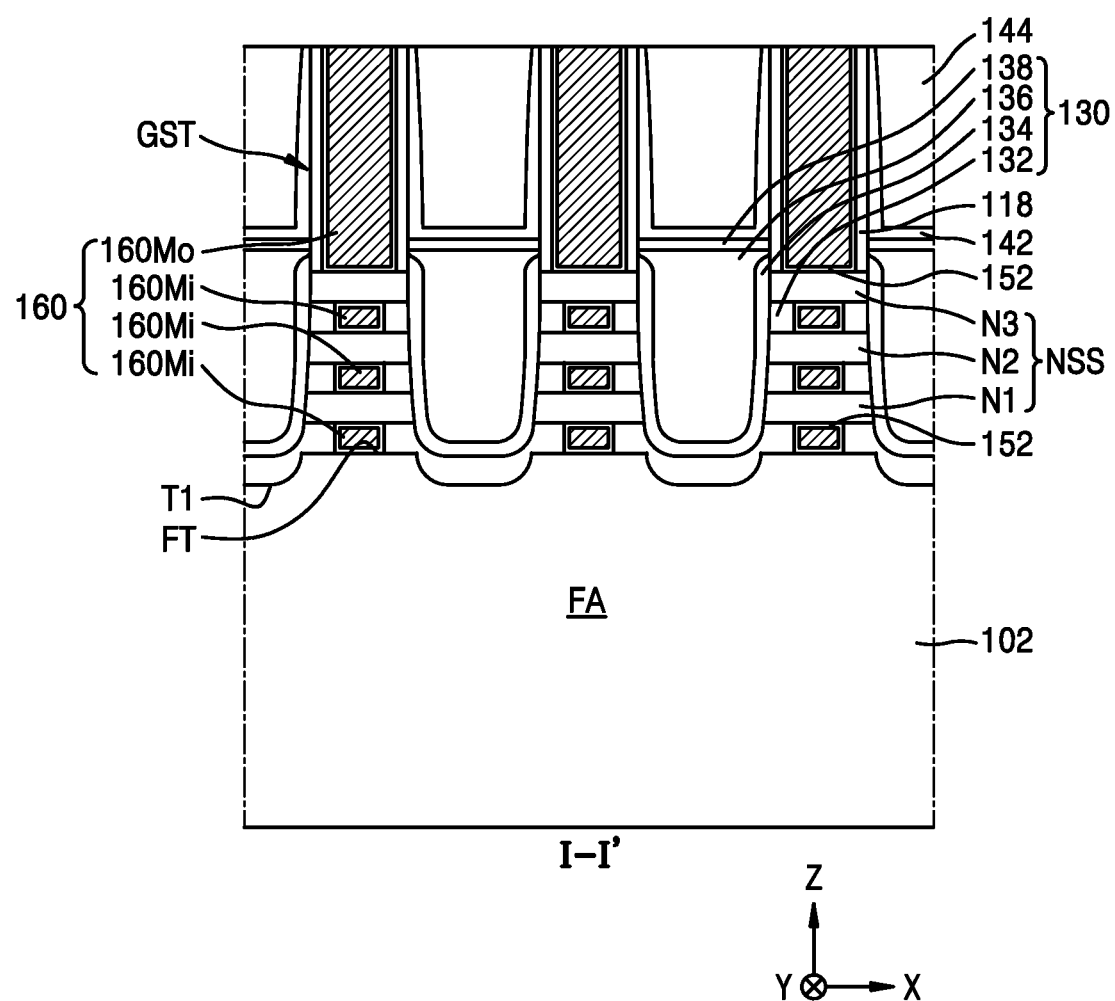

In the process of FIG. 14, while the dummy gate layer D124, the oxide layer D122, and the plurality of sacrificial semiconductor layers 104 are being removed by using a liquid or gaseous etchant, it may be possible for the etchant to penetrate to the source/drain region 130 through portions vulnerable to penetration of the etchant in a resultant product in which the gate space GS is formed. Therefore, the inside of the source/drain region may be damaged by the etchant. In this state, when the process for forming the gate dielectric layer 152 and the process for forming a gate forming conductive layer 160L of FIGS. 15 and 16 are performed, a metal-containing material needed for forming the gate dielectric layer 152 or the gate forming conductive layer 160L may penetrate through the vulnerable portions to the interior of the damaged source/drain region. As a result, a defect like a short circuit between the damaged source/drain region and the gate line 160 formed in a subsequent process (e.g., the processes of FIGS. 15 and 16) may occur. Also, leakage of the gate line 160 may increase.

However, according to the method of manufacturing a semiconductor device according to embodiments, as described above in the description of FIGS. 11A to 11D, the central impurity layer 136 that serves to apply stress to the plurality of nano-sheets N1, N2, and N3 is protected from an external attack and, to prevent short circuit and leakage, the source/drain region 130 includes the buffer layer 132 and the inner impurity layer 134, and thus a structure not vulnerable to an attack by an etchant used to remove the sacrificial semiconductor layer 104 including SiGe may be provided. Also, the inner impurity layer 134 may reinforce a weak portion of the buffer layer 132. Therefore, according to the method of manufacturing a semiconductor device according to embodiments, while the dummy gate layer D124, the oxide layer D122, and the plurality of sacrificial semiconductor layers 104 are being removed by using a liquid or gaseous etchant in the process of FIG. 14, it is possible to effectively prevent the source/drain region 130 from being damaged or degraded by an external attack.

Referring to FIG. 15, the gate dielectric layer 152 covering exposed surfaces of the plurality of nano-sheets N1, N2, and N3 and the fin active region FA is formed. The gate dielectric layer 152 may be formed through, for example, an atomic layer deposition (ALD) process.

Referring to FIG. 16, a gate-forming conductive layer is formed on the gate dielectric layer 152 to cover the top surface of the inter-gate insulation layer 144 and fill the gate space GS. The gate-forming conductive layer may include a metal, a metal nitride, a metal carbide, or a combination thereof. The gate-forming conductive layer may be formed through, for example, an ALD process.

After the gate-forming conductive layer is formed, the gate-forming conductive layer and a portion of the gate dielectric layer 152 are removed to expose the top surface of the inter-gate insulation layer 144. Therefore, the plurality of gate lines 160 filling a plurality of gate spaces GS may be formed on the gate dielectric layer 152. The gate line 160 may include the outer metal gate 160Mo and the inner metal gate 160Mi. Through a planarization process for forming the gate line 160, the height of the top surface of each of the spacer 118, the protective insulation layer 142, and the inter-gate insulation layer 144 may be lowered.

Figure 17:
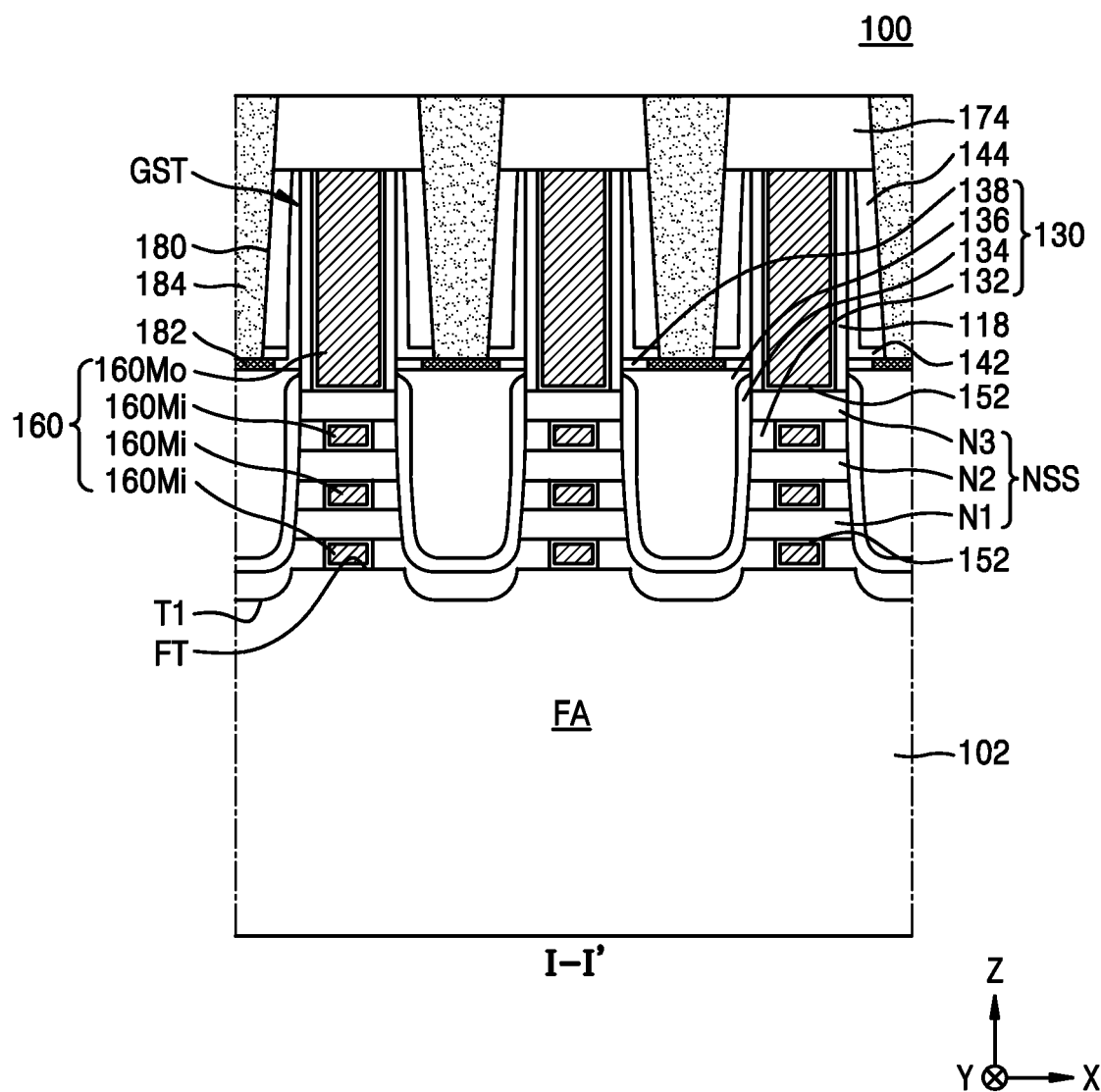

Referring to FIG. 17, after the gate line 160 is formed, the interlayer insulation layer 174 covering the gate line 160 is formed. Subsequently, a plurality of contact holes 180 exposing the source/drain regions 130 are formed by etching a portion of each of the interlayer insulation layer 174, the inter-gate insulation layer 144, and the protective insulation layer 142. The metal silicide layer 182 is formed on the top surfaces of the source/drain regions 130 exposed through the plurality of contact holes 180, and the contact plugs 184 filling the contact holes 180 are formed on the metal silicide layer 182. Therefore, the semiconductor device 100 shown in FIG. 2A may be manufactured.

According to some embodiments, in the process of forming the metal silicide layer 182, a silicide reaction between a portion of the capping layer 138 of the source/drain region 130 and a metal may be induced. Therefore, the metal silicide layer 182 may be obtained from the portion of the capping layer 138. According to some other embodiments, the process of forming the metal silicide layer 182 may be omitted.

According to the method of manufacturing a semiconductor device described with reference to FIGS. 5A-5B, 6A-6B, 7A-7B, 8-10, 11A-11D, and 12-17, even when there are portions structurally vulnerable to penetration of a liquid or gaseous etchant during the process of manufacturing a semiconductor device, the buffer layer 132 and the inner impurity layer 134 included in the source/drain region 130 may prevent the central impurity layer 136 in the source/drain region 130 from being damaged or etched. Therefore, during the process of manufacturing a semiconductor device according to embodiments, defects like degradation of the source/drain region 130 by an external attack or a short circuit between the source/drain region 130 and the gate line 160 may be suppressed. Also, in the process of manufacturing a semiconductor device according to embodiments, because a buffer layer having a deep indentation structure is formed, the short circuit problem and the leakage problem of the gate line 160 may be more effectively prevented. Furthermore, by increasing the volume of the source/drain region 130 based on the buffer layer having the deep indentation structure, resistance degradation of the channel region and the source/drain region 130 may be resolved. As a result, the method of manufacturing a semiconductor device according to embodiments may significantly improve the reliability of a semiconductor device.

While the embodiments been particularly shown and described herein, it will be understood that various changes in form and details may be made without departing from the spirit and scope of the following claims.

What is claimed is:
1. A semiconductor device comprising:
a fin active region having a structure protruding from a substrate and extending in a first direction;
a device isolation layer covering two sidewalls of the fin active region on the substrate;
a gate structure extending in a second direction on the fin active region and the device isolation layer, wherein the second direction intersects the first direction;
a nano-sheet structure comprising a plurality of nano-sheets spaced apart from each other in a vertical direction from a top surface of the fin active region;
source/drain regions disposed on the fin active region and adjacent to the gate structure; and
a buffer layer disposed on sides and bottom of the source/drain regions, wherein each source/drain region of the source/drain regions comprises an inner impurity layer, and a central impurity layer which are sequentially stacked, wherein the buffer layer comprises a side buffer layer filling a first indentation between two vertically-adjacent nano-sheets and a second indentation between the top surface of the fin active region and a nano-sheet, and a bottom buffer layer contacting the top surface of the fin active region, and wherein the plurality of nano-sheets contact side surfaces of the inner impurity layer.

2. The semiconductor device of claim 1, wherein an inner metal gate of the gate structure is disposed between the two vertically-adjacent nano-sheets, and between the top surface of the fin active region and the nano-sheet, wherein an outer metal gate of the gate structure is disposed on an uppermost nano-sheet of the nano-sheet structure and the device isolation layer, and wherein the side buffer layer fills the first indentation and the second indentation on both sides of the inner metal gate in the first direction.

3. The semiconductor device of claim 1, wherein the inner impurity layer comprises a bottom portion surrounding a bottom surface of the central impurity layer and a side portion surrounding side surfaces of the central impurity layer, and wherein the plurality of nano-sheets contact the side portion of the inner impurity layer.

4. The semiconductor device of claim 1, wherein the inner impurity layer comprises a bottom portion surrounding a bottom surface of the central impurity layer and a side portion surrounding side surfaces of the central impurity layer, and wherein the buffer layer is not disposed between the plurality of nano-sheets and the side portion of the inner impurity layer in the first direction.

5. The semiconductor device of claim 1, wherein the buffer layer comprises undoped Si or $Si_{1-x}Ge_x$, where x<0.1, wherein the inner impurity layer comprises Si doped with any one of P, As, and Sb, and wherein the central impurity layer comprises $Si_{1-y}P_y$, where $0.04 \leq y \leq 0.12$.

6. The semiconductor device of claim 1, wherein a thickness of the bottom buffer layer is less than or equal to 10 nanometers, and wherein a top surface of the bottom buffer layer is lower in the vertical direction than a top surface of an inner metal gate disposed at a lowermost portion of the gate structure.

7. The semiconductor device of claim 1, wherein the source/drain regions further comprise an outer impurity layer disposed between the buffer layer and the inner impurity layer and surrounding the inner impurity layer, and wherein the outer impurity layer comprises Si doped with C, or SiGe doped with C.

8. The semiconductor device of claim 7, wherein the outer impurity layer comprises a bottom portion on a bottom surface of the inner impurity layer, the bottom portion of the outer impurity layer has a thickness in a range from about 2 nanometers to about 10 nanometers, and a concentration of C is less than 0.5%.

9. The semiconductor device of claim 1, wherein an inner metal gate of the gate structure is disposed between the two vertically-adjacent nano-sheets and between the top surface of the fin active region and the nano-sheet, wherein an outer metal gate of the gate structure is disposed on an uppermost nano-sheet of the nano-sheet structure and the device isolation layer, and wherein positions of ends of the inner metal gate differ from positions of ends of the outer metal gate in the first direction by less than or equal to 5 nanometers.

10. The semiconductor device of claim 1, wherein the inner impurity layer comprises a bottom portion surrounding a bottom surface of the central impurity layer and a side portion surrounding side surfaces of the central impurity layer, and wherein a thickness of the bottom portion of the inner impurity layer is greater than a thickness of the side portion of the inner impurity layer, and wherein a difference between the thickness of the bottom portion of the inner impurity layer and the thickness of the side portion of the inner impurity layer is less than or equal to 5 nanometers.

11. The semiconductor device of claim 1, wherein a proximity between an outermost surface of an outer metal gate of the gate structure and an outermost surface of the source/drain region in the first direction is less than or equal to 10 nanometers.

12. The semiconductor device of claim 1, wherein, in the vertical direction, a top surface of the central impurity layer is located at a position within a range from −2 nm to 5 nm from a top surface of an uppermost nano-sheet of the nano-sheet structure.

13. The semiconductor device of claim 1, wherein the inner impurity layer comprises Si doped with As or P, and wherein the inner impurity layer comprises a void.

14. A semiconductor device comprising:

a fin active region extending in a first direction;

a gate structure extending across the fin active region in a second direction perpendicular to the first direction;

a nano-sheet structure comprising a plurality of nano-sheets spaced apart from each other in a vertical direction from a top surface of the fin active region;

source/drain regions disposed on the fin active region on both sides of the gate structure; and a buffer layer disposed on sides and bottom of the source/drain regions, wherein the source/drain regions comprise an inner impurity layer, and a central impurity layer which are sequentially stacked, wherein the buffer layer comprises a plurality of protrusions extending in the first direction and spaced apart from each other in the vertical direction, and wherein an end portion of each of the plurality of nano-sheets is sandwiched between two vertically-adjacent protrusions or between a spacer of the gate structure and a protrusion, wherein the end portion contacts the inner impurity layer, and wherein the buffer layer comprises a bottom portion contacting the top surface of the fin active region.

15. The semiconductor device of claim 14, wherein an inner metal gate of the gate structure is disposed between two vertically-adjacent nano-sheets and between the top surface of the fin active region and a nano-sheet, wherein an outer metal gate of the gate structure is disposed on an uppermost nano-sheet of the nano-sheet structure, and wherein the buffer layer fills indentations on both sides of the inner metal gate in the first direction.

16. The semiconductor device of claim 14, wherein the inner impurity layer comprises a bottom portion surrounding a bottom surface of the central impurity layer and a side portion surrounding side surfaces of the central impurity layer, and wherein the buffer layer is not disposed between the plurality of nano-sheets and the side portion of the inner impurity layer in the first direction.

17. The semiconductor device of claim 14, wherein the source/drain regions further comprise an outer impurity layer disposed between the buffer layer and the inner impurity layer, and surrounding the inner impurity layer.

18. The semiconductor device of claim 17, wherein the buffer layer comprises undoped Si or $Si_{1-x}Ge_x$ (x<0.1), wherein the inner impurity layer comprises Si doped with one of P, As, and Sb, wherein the central impurity layer comprises $Si_{1-y}P_y$, wherein $0.04 \le y \le 0.12$, and wherein the outer impurity layer comprises Si doped with C, or SiGe doped with C.

19. A semiconductor device comprising:

a fin active region protruding from a substrate and extending in a first horizontal direction;

a gate structure extending in a second horizontal direction on the fin active region, wherein the second horizontal direction intersects the first horizontal direction;

a first nano-sheet spaced apart from the fin active region in a vertical direction;

a second nano-sheet spaced apart from the first nano-sheet in the vertical direction;

a source/drain region disposed on the fin active region and adjacent to the gate structure, and comprising an inner impurity layer; and a buffer layer disposed on sides and bottom of the source/drain region, wherein the buffer layer comprises a side buffer layer filling a first indentation between the fin active region and the first nano-sheet and a second indentation between the first nano-sheet and the second nano-sheet, and a bottom buffer layer contacting a top surface of the fin active region, and wherein the first nano-sheet and the second nano-sheet contact side surfaces of the inner impurity layer.

20. The semiconductor device of claim 19, wherein a first inner metal gate of the gate structure is disposed between the fin active region and the first nano-sheet, wherein a second inner metal gate of the gate structure is disposed between the first nano-sheet and the second nano-sheet, and wherein the side buffer layer fills the first indentation on both sides of the first inner metal gate in a first direction, and wherein the side buffer layer fills the second indentation on both sides of the second inner metal gate in the first direction.

\* \* \* \* \*